United States Patent
Chang et al.

(10) Patent No.: US 12,243,964 B2
(45) Date of Patent: Mar. 4, 2025

(54) DISPLAY DEVICE USING MICRO LED HAVING OUTWARD PROTRUSION FOR ASSEMBLY AND MANUFACTURING METHOD THEREFOR

(71) Applicant: LG ELECTRONICS INC., Seoul (KR)

(72) Inventors: Wonjae Chang, Seoul (KR); Jisoo Ko, Seoul (KR); Hyeyoung Yang, Seoul (KR); Hyunwoo Cho, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 476 days.

(21) Appl. No.: 17/633,520

(22) PCT Filed: Aug. 21, 2019

(86) PCT No.: PCT/KR2019/010638
§ 371 (c)(1),
(2) Date: Feb. 7, 2022

(87) PCT Pub. No.: WO2021/033801
PCT Pub. Date: Feb. 25, 2021

(65) Prior Publication Data
US 2022/0293823 A1      Sep. 15, 2022

(30) Foreign Application Priority Data
Aug. 20, 2019   (KR) .................. 10-2019-0101594

(51) Int. Cl.
H01L 33/38    (2010.01)
H01L 27/15    (2006.01)
(Continued)

(52) U.S. Cl.
CPC .......... *H01L 33/382* (2013.01); *H01L 27/156* (2013.01); *H01L 33/005* (2013.01); *H01L 33/62* (2013.01); *H01L 2933/0016* (2013.01)

(58) Field of Classification Search
CPC ... H01L 33/382; H01L 27/156; H01L 33/005; H01L 33/62; H01L 2224/83101;
(Continued)

(56) References Cited

U.S. PATENT DOCUMENTS

2006/0220989 A1   10/2006   Hillis et al.
2016/0099383 A1    4/2016   Yuh
(Continued)

FOREIGN PATENT DOCUMENTS

CN    109065677    12/2018
KR    101620469     5/2016
(Continued)

OTHER PUBLICATIONS

European Patent Office Application Serial No. 19942395.5, Search Report dated Sep. 12, 2023, 7 pages.
(Continued)

*Primary Examiner* — Nduka E Ojeh
*Assistant Examiner* — Laura M Dykes
(74) *Attorney, Agent, or Firm* — LEE, HONG, DEGERMAN, KANG & WAIMEY

(57) ABSTRACT

Provided in the present specification are a substrate structure having an exclusive design for allowing assembly on a substrate, at the same time, of a plurality of semiconductor light emitting devices having various colors, and a new type of semiconductor light emitting device, such that the semiconductor light emitting devices can be quickly and accurately assembled on the substrate with a concern about color mixing. Here, at least one of the plurality of semiconductor light emitting devices, according to one embodiment of the (Continued)

present invention, comprises a bump part located in the lateral direction of a surface to be assembled. An assembly groove in which the semiconductor light emitting device including the bump part is assembled is provided with a protrusion part facing toward the inside of the assembly groove.

15 Claims, 21 Drawing Sheets

(51) Int. Cl.
  *H01L 33/00* (2010.01)
  *H01L 33/62* (2010.01)
(58) Field of Classification Search
  CPC . H01L 2224/95144; H01L 2924/12041; H01L 27/3295; H01L 27/3283; H01L 27/3246
  USPC .......................................................... 257/79
  See application file for complete search history.

(56) References Cited

U.S. PATENT DOCUMENTS

| | | | |
|---|---|---|---|
| 2017/0104009 | A1 | 4/2017 | Peng et al. |
| 2020/0058533 | A1 | 2/2020 | Zou et al. |
| 2020/0185368 | A1* | 6/2020 | Park ................... H01L 33/0093 |
| 2021/0005776 | A1* | 1/2021 | Lin ........................ H01L 24/75 |

FOREIGN PATENT DOCUMENTS

| | | |
|---|---|---|
| KR | 1020180030454 | 3/2018 |
| KR | 1020190075869 | 7/2019 |

OTHER PUBLICATIONS

PCT International Application No. PCT/KR2019/010638, International Search Report dated May 20, 2020, 21 pages.

* cited by examiner (a)                                    (b)

(a) (b) (c)

DISPLAY DEVICE USING MICRO LED HAVING OUTWARD PROTRUSION FOR ASSEMBLY AND MANUFACTURING METHOD THEREFOR

CROSS-REFERENCE TO RELATED APPLICATIONS

This application is the National Stage filing under 35 U.S.C. 371 of International Application No. PCT/KR2019/010638, filed on Aug. 21, 2019, which claims the benefit of earlier filing date and right of priority to Korean Application No. 10-2019-0101594, filed on Aug. 20, 2019, the contents of which are all hereby incorporated by reference herein their entirety.

TECHNICAL FIELD

The present disclosure is applicable to the display device related technical fields, and relates to a display device using micro-Light Emitting Diodes (LEDs) and a manufacturing method thereof.

BACKGROUND ART

Recently, in a field of a display technology, display devices having excellent characteristics such as thinness, flexibility, and the like have been developed. On the other hand, currently commercialized major displays are represented by a LCD (liquid crystal display) and an OLED (organic light emitting diode).

However, the LCD has a response time that is not fast, and is difficult to be flexibly implemented.

On the other hand, LED (light emitting diode), which is a well-known semiconductor light-emitting element that converts electric current into light, has been used as a light source for a display image of an electronic device including an information and communication device along with a GaP:N-based green LED, starting with commercialization of a red LED using a GaAsP compound semiconductor in 1962. Accordingly, a method for solving the above-described problems by implementing a display using the semiconductor light-emitting element may be proposed. Such light emitting diode has various advantages, such as long lifespan, low power consumption, excellent initial driving characteristics, high vibration resistance, and the like, compared to a filament-based light-emitting element.

However, in order to implement a large-scale and high-pixel display device using semiconductor light emitting elements, a large number of semiconductor light emitting elements needs to be quickly and accurately assembled on or transferred to a wiring board of the display device.

Accordingly, the present disclosure suggests new types of semiconductor light emitting elements and a substrate structure in which the semiconductor light emitting elements configured to emit light of various colors can be quickly and accurately assembled in a substrate.

DISCLOSURE

Technical Task

One object of the present disclosure is to provide a display device using semiconductor light emitting elements and a manufacturing method thereof.

Another object of the present disclosure is to provide a display device and a manufacturing method thereof, which may improve an assembly speed when semiconductor light emitting elements configured to emit light of various colors are assembled on a substrate.

Yet another object of the present disclosure is to solve various problems not mentioned herein. Those skilled in the art may understand it through the full text of the specification and drawings.

Technical Solutions

In order to accomplish the above and other objects, a display device using semiconductor light emitting elements according to one aspect of the present disclosure includes a substrate, assembly electrodes located on the substrate, an insulating layer located on the assembly electrodes, a partition located on the insulating layer, a first assembly recess defined by the partition, and a first semiconductor light emitting element assembled with the first assembly recess and including at least one bump part located in a lateral direction of a surface of the first semiconductor light emitting element to be assembled, wherein the partition configured to surround the first assembly recess includes at least one protrusion part configured to protrude towards an inside of the first assembly recess.

A minimum width X1 of the first assembly recess may be equal to or greater than a minimum width Y1 of the first semiconductor light emitting element, a maximum width X2 of the first assembly recess may be equal to or greater than a maximum width Y2 of the first semiconductor light emitting element, and the maximum width Y2 of the first semiconductor light emitting element may be greater than the minimum width X1 of the first assembly recess.

The surface of the first semiconductor light emitting element to be assembled other than the at least one bump part may have a circular shape.

The first assembly recess defined by the partition other than the at least one protrusion part may have a circular shape.

The number of the at least one bump part of the first semiconductor light emitting element may be equal to the number of the at least one protrusion part of the partition.

The display device may further include a second semiconductor light emitting element and a second assembly recess configured such that the second semiconductor light emitting element is assembled therewith.

The second semiconductor light emitting element may have a shape different from a shape of the first semiconductor light emitting element, and the second assembly recess may have a shape corresponding to the shape of the second semiconductor light emitting element.

The first semiconductor light emitting element may emit light of a first color, and the second semiconductor light emitting element may emit light of a second color different from the first color.

Each of the first semiconductor light emitting element and the second semiconductor light emitting element may include a magnetic layer.

A manufacturing method of a display device using a plurality of semiconductor light emitting elements according to another aspect of the present disclosure includes forming the plurality of semiconductor light emitting elements having different shapes on individual growth substrates, preparing an assembly substrate provided with assembly recesses configured such that the semiconductor light emitting elements are assembled therewith, separating the semiconductor light emitting elements from the growth substrates, and then putting the semiconductor light emitting elements into a chamber filled with a fluid, and locating the assembly substrate on an upper surface of the chamber, and assembling the semiconductor light emitting elements with the assembly recesses of the assembly substrate using a magnetic field and an electric field, wherein at least one of the semiconductor light emitting elements includes at least one bump part provided in a lateral direction of a surface thereof to be assembled.

A first assembly recess configured such that the at least one semiconductor light emitting element including the at least one bump part is assembled therewith may be defined by a partition configured to surround the first assembly recess, and the partition may include at least one protrusion part located to protrude towards an inside of the first assembly recess.

Each of the semiconductor light emitting elements may include a magnetic layer, and the assembling the semiconductor light emitting elements with the assembly recesses of the assembly substrate may include locating an assembly apparatus having a magnetic body on a rear surface of the assembly substrate not provided with the assembly recesses, and allowing the semiconductor light emitting elements to come into contact with the assembly recesses of the assembly substrate by a magnetic field generated depending on movement of the assembly apparatus.

The movement of the assembly apparatus may include rotational movement, and the allowing the semiconductor light emitting elements to come into contact with the assembly recesses of the assembly substrate may include rotating the semiconductor light emitting elements in the assembly recesses of the assembly substrate.

The manufacturing method may further include transferring the semiconductor light emitting elements assembled on the assembly substrate to a transfer substrate, and transferring the semiconductor light emitting elements transferred to the transfer substrate to a wiring substrate.

The transferring the semiconductor light emitting elements transferred to the transfer substrate to the wiring substrate may include forming wired electrodes and a conductive adhesive layer on the wiring substrate, and adhering the semiconductor light emitting elements on the transfer substrate to the conductive adhesive layer of the wiring substrate.

The semiconductor light emitting elements may be micrometer-sized light emitting diodes (micro-LEDs).

Advantageous Effects

According to one embodiment of the present disclosure, a display device using semiconductor light emitting elements and a manufacturing method thereof may be provided.

Specifically, a substrate structure having an exclusive design and new types of semiconductor light emitting elements so as to simultaneously assemble the semiconductor light emitting elements configured to emit light of various colors on a substrate are provided, and thereby, the semiconductor light emitting elements may be quickly and accurately assembled on the substrate without concern about color mixing.

Furthermore, according to another embodiment of the present disclosure, additional effects not mentioned herein may be exhibited. Those of ordinary skill in the art may understand it through the full text of the specification and drawings.

BEST MODE FOR DISCLOSURE

Reference will now be made in detail to embodiments of the present disclosure, examples of which are illustrated in the accompanying drawings. Wherever possible, the same reference numbers will be used throughout the drawings to refer to the same or like parts, and redundant description thereof will be omitted. As used herein, the suffixes "module" and "unit" are added or used interchangeably to facilitate preparation of this specification and are not intended to suggest distinct meanings or functions. In describing embodiments disclosed in this specification, relevant well-known technologies may not be described in detail in order not to obscure the subject matter of the embodiments disclosed in this specification. In addition, it should be noted that the accompanying drawings are only for easy understanding of the embodiments disclosed in the present specification, and should not be construed as limiting the technical spirit disclosed in the present specification.

Furthermore, although the drawings are separately described for simplicity, embodiments implemented by combining at least two or more drawings are also within the scope of the present disclosure.

In addition, when an element such as a layer, region or module is described as being "on" another element, it is to be understood that the element may be directly on the other element or there may be an intermediate element between them.

The display device described herein is a concept including all display devices that display information with a unit pixel or a set of unit pixels. Therefore, the display device may be applied not only to finished products but also to parts. For example, a panel corresponding to a part of a digital TV also independently corresponds to the display device in the present specification. The finished products include a mobile phone, a smartphone, a laptop, a digital broadcasting terminal, a personal digital assistant (PDA), a portable multimedia player (PMP), a navigation system, a slate PC, a tablet, an Ultrabook, a digital TV, a desktop computer, and the like.

However, it will be readily apparent to those skilled in the art that the configuration according to the embodiments described herein is applicable even to a new product that will be developed later as a display device.

In addition, the semiconductor light emitting element mentioned in this specification is a concept including an LED, a micro LED, and the like, and may be used interchangeably therewith.

Figure 1:
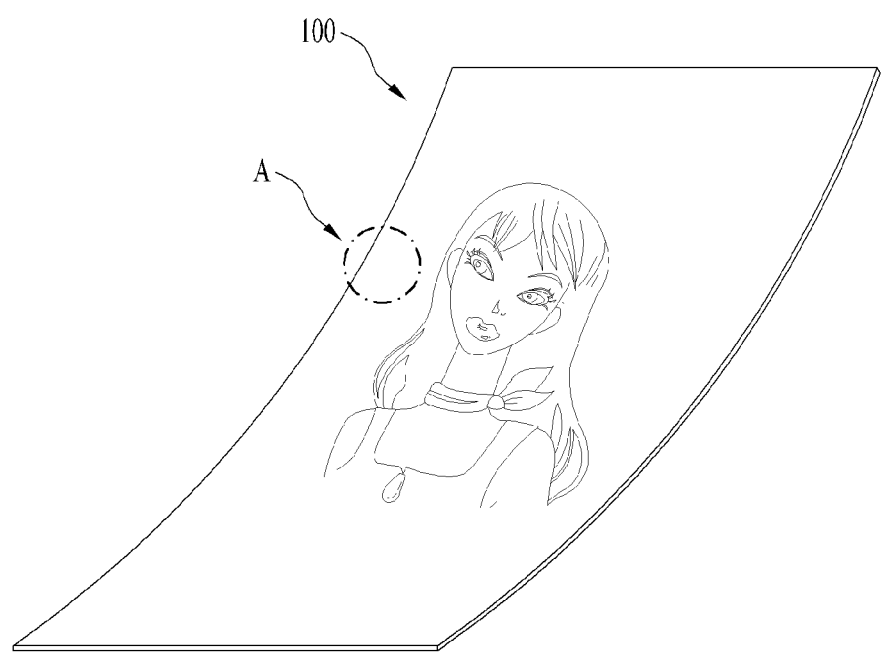
FIG. 1 is a conceptual diagram illustrating an embodiment of a display device using a semiconductor light emitting element according to the present disclosure.

FIG. 1 is a conceptual view illustrating an embodiment of a display device using a semiconductor light emitting element according to the present disclosure.

As shown in FIG. 1, information processed by a controller (not shown) of a display device 100 may be displayed using a flexible display.

The flexible display may include, for example, a display that can be warped, bent, twisted, folded, or rolled by external force.

Furthermore, the flexible display may be, for example, a display manufactured on a thin and flexible substrate that can be warped, bent, folded, or rolled like paper while maintaining the display characteristics of a conventional flat panel display.

When the flexible display remains in an unbent state (e.g., a state having an infinite radius of curvature) (hereinafter referred to as a first state), the display area of the flexible display forms a flat surface. When the display in the first sate is changed to a bent state (e.g., a state having a finite radius of curvature) (hereinafter referred to as a second state) by external force, the display area may be a curved surface. As shown in FIG. 1, the information displayed in the second state may be visual information output on a curved surface. Such visual information may be implemented by independently controlling the light emission of sub-pixels arranged in a matrix form. The unit pixel may mean, for example, a minimum unit for implementing one color.

The unit pixel of the flexible display may be implemented by a semiconductor light emitting element. In the present disclosure, a light emitting diode (LED) is exemplified as a type of the semiconductor light emitting element configured to convert electric current into light. The LED may be formed in a small size, and may thus serve as a unit pixel even in the second state.

Hereinafter, a flexible display implemented using the LED will be described in more detail with reference to the drawings.

Figure 2:
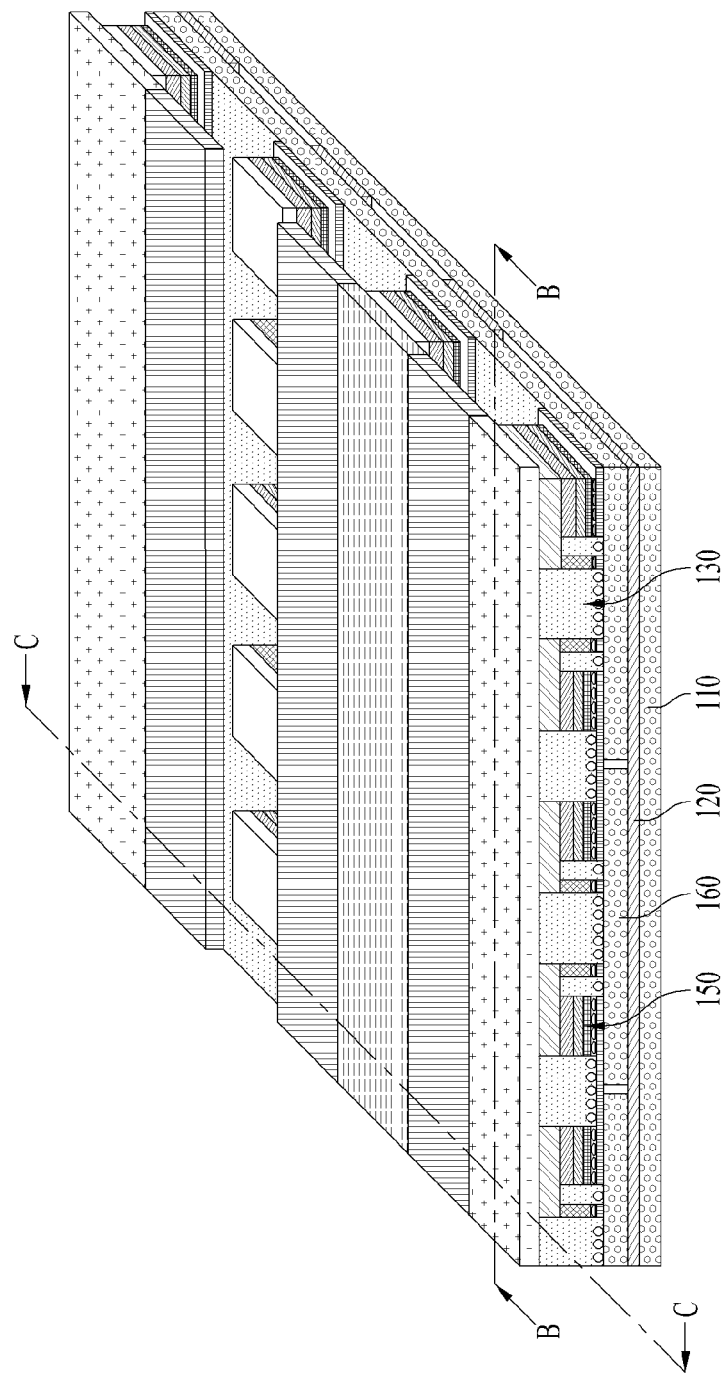
FIG. 2 is a partially enlarged diagram showing a part A shown in FIG. 1.

FIG. 2 is a partially enlarged view showing part A of FIG. 1.

Figure 3A:
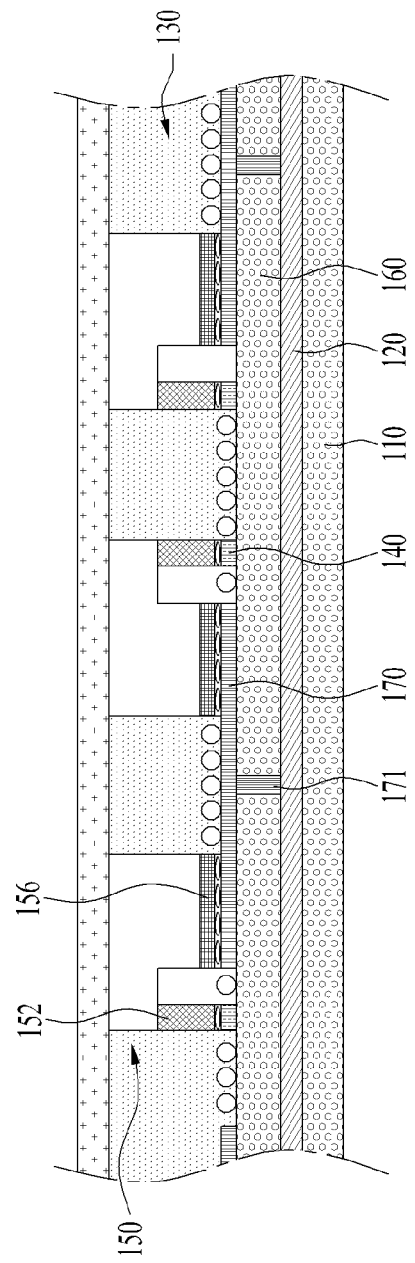
FIGS. 3A and 3B are cross-sectional diagrams taken along the cutting lines B-B and C-C in FIG. 2.
Figure 3B:
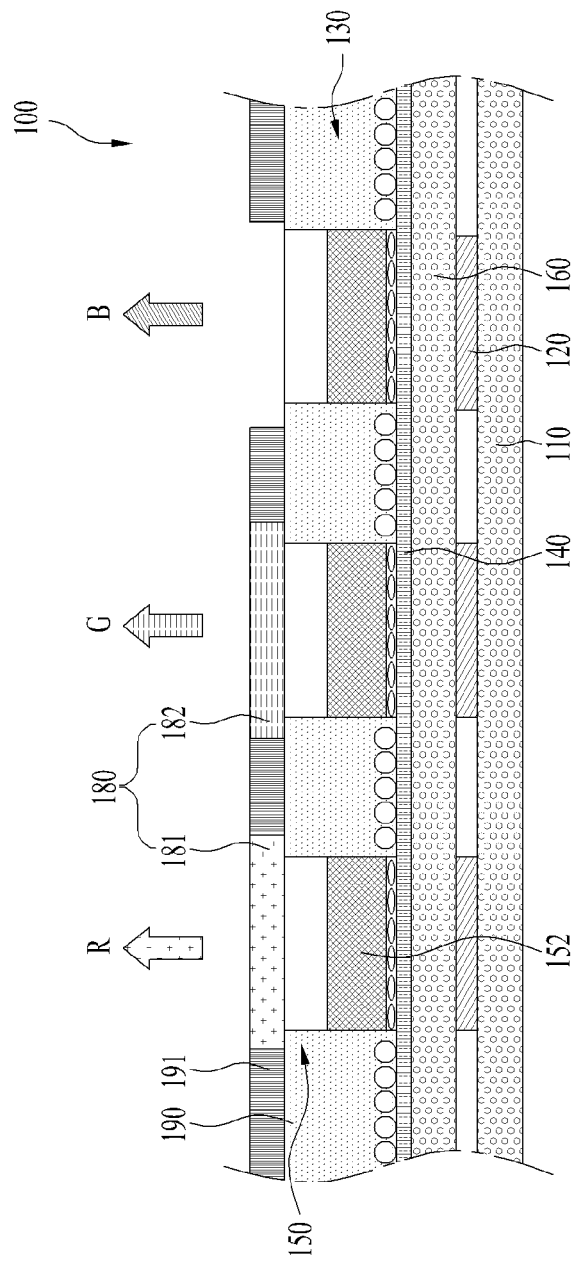

FIGS. 3A and 3B are cross-sectional views taken along lines B-B and C-C in FIG. 2.

Figure 4:
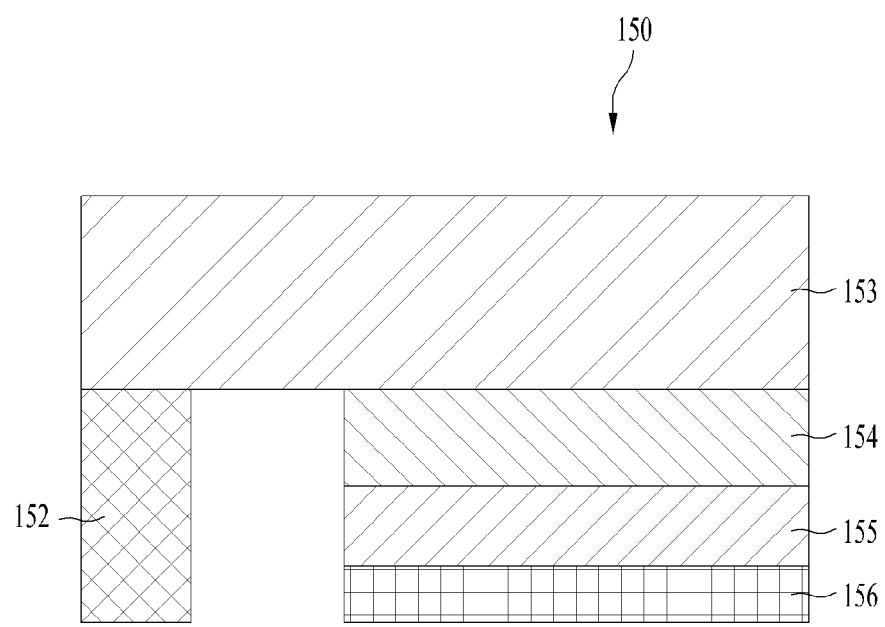
FIG. 4 is a conceptual diagram illustrating the flip-chip type semiconductor light emitting element of FIG. 3.

FIG. 4 is a conceptual view illustrating the flip-chip type semiconductor light emitting element of FIG. 3.

Figure 5A:
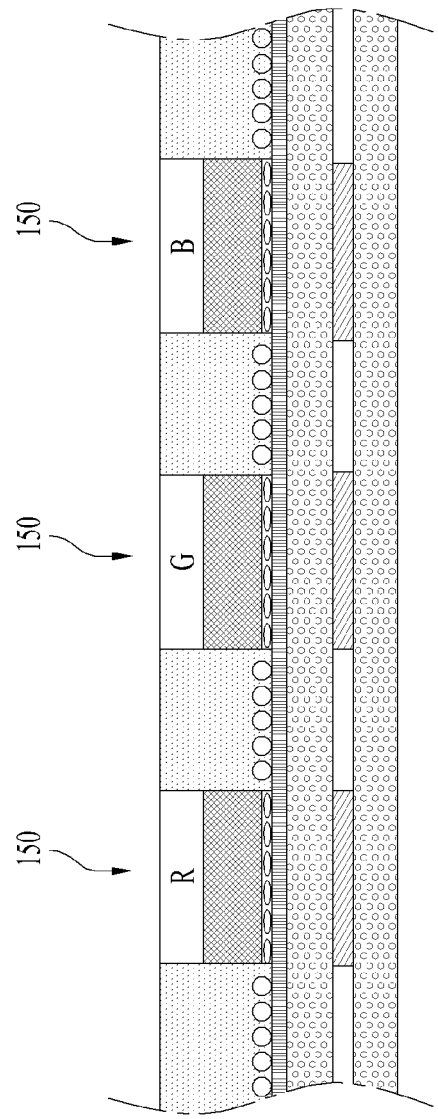
FIGS. 5A to 5C are conceptual diagrams illustrating various examples of color implementation with respect to a flip-chip type semiconductor light emitting element.
Figure 5B:
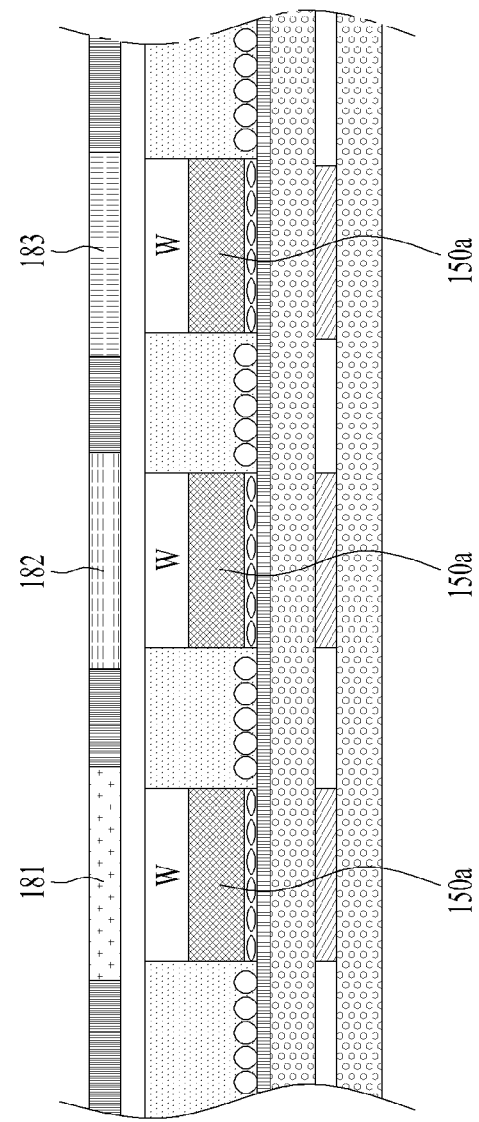
Figure 5C:
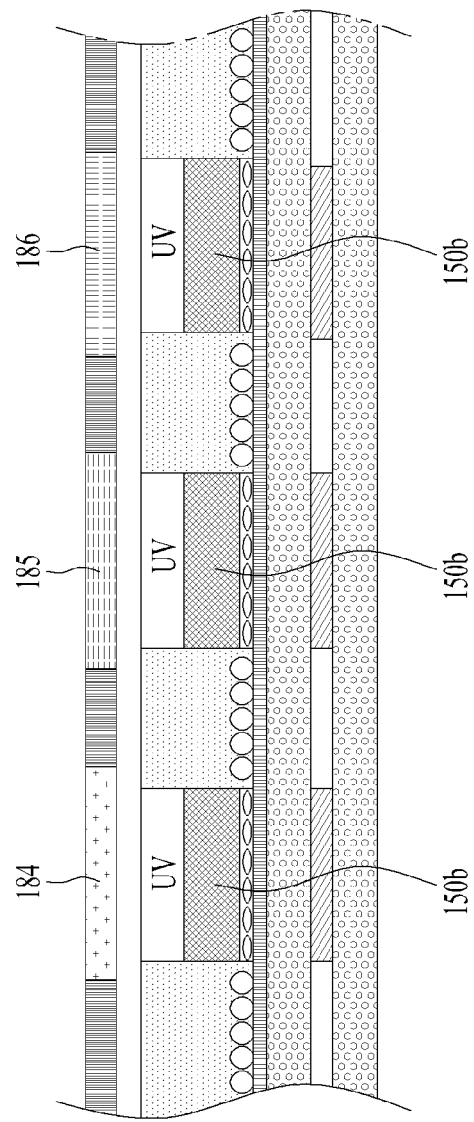

FIGS. 5A to 5C are conceptual views illustrating various examples of implementation of colors in relation to a flip-chip type semiconductor light emitting element.

As shown in FIGS. 2, 3A and 3B, the display device 100 using a passive matrix (PM) type semiconductor light emitting element is exemplified as the display device 100 using a semiconductor light emitting element. However, the examples described below are also applicable to an active matrix (AM) type semiconductor light emitting element.

The display device 100 shown in FIG. 1 may include a substrate 110, a first electrode 120, a conductive adhesive layer 130, a second electrode 140, and at least one semiconductor light emitting element 150, as shown in FIG. 2.

The substrate 110 may be a flexible substrate. For example, to implement a flexible display device, the substrate 110 may include glass or polyimide (PI). Any insulative and flexible material such as polyethylene naphthalate (PEN) or polyethylene terephthalate (PET) may be employed. In addition, the substrate 110 may be formed of either a transparent material or an opaque material.

The substrate 110 may be a wiring substrate on which the first electrode 120 is disposed. Thus, the first electrode 120 may be positioned on the substrate 110.

As shown in FIG. 3A, an insulating layer 160 may be disposed on the substrate 110 on which the first electrode 120 is positioned, and an auxiliary electrode 170 may be positioned on the insulating layer 160. In this case, a stack in which the insulating layer 160 is laminated on the substrate 110 may be a single wiring substrate. More specifically, the insulating layer 160 may be formed of an insulative and flexible material such as PI, PET, or PEN, and may be integrated with the substrate 110 to form a single substrate.

The auxiliary electrode 170, which is an electrode that electrically connects the first electrode 120 and the semiconductor light emitting element 150, is positioned on the insulating layer 160, and is disposed to correspond to the position of the first electrode 120. For example, the auxiliary electrode 170 may have a dot shape and may be electrically connected to the first electrode 120 by an electrode hole 171 formed through the insulating layer 160. The electrode hole 171 may be formed by filling a via hole with a conductive material.

As shown in FIG. 2 or 3A, a conductive adhesive layer 130 may be formed on one surface of the insulating layer 160, but embodiments of the present disclosure are not limited thereto. For example, a layer performing a specific function may be formed between the insulating layer 160 and the conductive adhesive layer 130, or the conductive adhesive layer 130 may be disposed on the substrate 110 without the insulating layer 160. In a structure in which the conductive adhesive layer 130 is disposed on the substrate 110, the conductive adhesive layer 130 may serve as an insulating layer.

The conductive adhesive layer 130 may be a layer having adhesiveness and conductivity. For this purpose, a material having conductivity and a material having adhesiveness may be mixed in the conductive adhesive layer 130. In addition, the conductive adhesive layer 130 may have ductility, thereby providing making the display device flexible.

As an example, the conductive adhesive layer 130 may be an anisotropic conductive film (ACF), an anisotropic conductive paste, a solution containing conductive particles, or the like. The conductive adhesive layer 130 may be configured as a layer that allows electrical interconnection in the direction of the Z-axis extending through the thickness, but is electrically insulative in the horizontal X-Y direction. Accordingly, the conductive adhesive layer 130 may be referred to as a Z-axis conductive layer (hereinafter, referred to simply as a "conductive adhesive layer").

The ACF is a film in which an anisotropic conductive medium is mixed with an insulating base member. When the ACF is subjected to heat and pressure, only a specific portion thereof becomes conductive by the anisotropic conductive medium. Hereinafter, it will be described that heat and pressure are applied to the ACF. However, another method may be used to make the ACF partially conductive. The other method may be, for example, application of only one of the heat and pressure or UV curing.

In addition, the anisotropic conductive medium may be, for example, conductive balls or conductive particles. For example, the ACF may be a film in which conductive balls are mixed with an insulating base member. Thus, when heat and pressure are applied to the ACF, only a specific portion of the ACF is allowed to be conductive by the conductive balls. The ACF may contain a plurality of particles formed by coating the core of a conductive material with an insulating film made of a polymer material. In this case, as the insulating film is destroyed in a portion to which heat and pressure are applied, the portion is made to be conductive by the core. At this time, the cores may be deformed to form layers that contact each other in the thickness direction of the film. As a more specific example, heat and pressure are applied to the whole ACF, and an electrical connection in the Z-axis direction is partially formed by the height difference of a counterpart adhered by the ACF.

As another example, the ACF may contain a plurality of particles formed by coating an insulating core with a conductive material. In this case, as the conductive material is deformed (pressed) in a portion to which heat and pressure are applied, the portion is made to be conductive in the thickness direction of the film. As another example, the conductive material may be disposed through the insulating base member in the Z-axis direction to provide conductivity in the thickness direction of the film. In this case, the conductive material may have a pointed end.

The ACF may be a fixed array ACF in which conductive balls are inserted into one surface of the insulating base member. More specifically, the insulating base member may be formed of an adhesive material, and the conductive balls may be intensively disposed on the bottom portion of the insulating base member. Thus, when the base member is subjected to heat and pressure, it may be deformed together with the conductive balls, exhibiting conductivity in the vertical direction.

However, the present disclosure is not necessarily limited thereto, and the ACF may be formed by randomly mixing conductive balls in the insulating base member, or may be composed of a plurality of layers with conductive balls arranged on one of the layers (as a double-ACF).

The anisotropic conductive paste may be a combination of a paste and conductive balls, and may be a paste in which conductive balls are mixed with an insulating and adhesive base material. Also, the solution containing conductive particles may be a solution containing any conductive particles or nanoparticles.

Referring back to FIG. 3A, the second electrode 140 is positioned on the insulating layer 160 and spaced apart from the auxiliary electrode 170. That is, the conductive adhesive layer 130 is disposed on the insulating layer 160 having the auxiliary electrode 170 and the second electrode 140 positioned thereon.

After the conductive adhesive layer 130 is formed with the auxiliary electrode 170 and the second electrode 140 positioned on the insulating layer 160, the semiconductor light emitting element 150 is connected thereto in a flip-chip form by applying heat and pressure. Thereby, the semiconductor light emitting element 150 is electrically connected to the first electrode 120 and the second electrode 140.

Referring to FIG. 4, the semiconductor light emitting element may be a flip chip-type light emitting device.

For example, the semiconductor light emitting element may include a p-type electrode 156, a p-type semiconductor layer 155 on which the p-type electrode 156 is formed, an active layer 154 formed on the p-type semiconductor layer 155, an n-type semiconductor layer 153 formed on the active layer 154, and an n-type electrode 152 disposed on the n-type semiconductor layer 153 and horizontally spaced apart from the p-type electrode 156. In this case, the p-type electrode 156 may be electrically connected to the auxiliary electrode 170, which is shown in FIG. 3, by the conductive adhesive layer 130, and the n-type electrode 152 may be electrically connected to the second electrode 140.

Referring back to FIGS. 2, 3A and 3B, the auxiliary electrode 170 may be elongated in one direction. Thus, one auxiliary electrode may be electrically connected to the plurality of semiconductor light emitting elements 150. For example, p-type electrodes of semiconductor light emitting elements on left and right sides of an auxiliary electrode may be electrically connected to one auxiliary electrode.

More specifically, the semiconductor light emitting element 150 may be press-fitted into the conductive adhesive layer 130 by heat and pressure. Thereby, only the portions of the semiconductor light emitting element 150 between the p-type electrode 156 and the auxiliary electrode 170 and between the n-type electrode 152 and the second electrode 140 may exhibit conductivity, and the other portions of the semiconductor light emitting element 150 do not exhibit conductivity as they are not press-fitted. In this way, the conductive adhesive layer 130 interconnects and electrically connects the semiconductor light emitting element 150 and the auxiliary electrode 170 and interconnects and electrically connects the semiconductor light emitting element 150 and the second electrode 140.

The plurality of semiconductor light emitting elements 150 may constitute a light emitting device array, and a phosphor conversion layer 180 may be formed on the light emitting device array.

The light emitting device array may include a plurality of semiconductor light emitting elements having different luminance values. Each semiconductor light emitting element 150 may constitute a unit pixel and may be electrically connected to the first electrode 120. For example, a plurality of first electrodes 120 may be provided, and the semiconductor light emitting elements may be arranged in, for example, several columns. The semiconductor light emitting elements in each column may be electrically connected to any one of the plurality of first electrodes.

In addition, since the semiconductor light emitting elements are connected in a flip-chip form, semiconductor light emitting elements grown on a transparent dielectric substrate may be used. The semiconductor light emitting elements may be, for example, nitride semiconductor light emitting elements. Since the semiconductor light emitting element 150 has excellent luminance, it may constitute an individual unit pixel even when it has a small size.

As shown in FIG. 3, a partition wall 190 may be formed between the semiconductor light emitting elements 150. In this case, the partition wall 190 may serve to separate individual unit pixels from each other, and may be integrated with the conductive adhesive layer 130. For example, by inserting the semiconductor light emitting element 150 into the ACF, the base member of the ACF may form the partition wall.

In addition, when the base member of the ACF is black, the partition wall 190 may have reflectance and increase contrast even without a separate black insulator.

As another example, a reflective partition wall may be separately provided as the partition wall 190. In this case, the partition wall 190 may include a black or white insulator depending on the purpose of the display device. When a partition wall including a white insulator is used, reflectivity may be increased. When a partition wall including a black insulator is used, it may have reflectance and increase contrast.

The phosphor conversion layer 180 may be positioned on the outer surface of the semiconductor light emitting element 150. For example, the semiconductor light emitting element 150 may be a blue semiconductor light emitting element that emits blue (B) light, and the phosphor conversion layer 180 may function to convert the blue (B) light into a color of a unit pixel. The phosphor conversion layer 180 may be a red phosphor 181 or a green phosphor 182 constituting an individual pixel.

That is, the red phosphor 181 capable of converting blue light into red (R) light may be laminated on a blue semiconductor light emitting element at a position of a unit pixel of red color, and the green phosphor 182 capable of converting blue light into green (G) light may be laminated on the blue semiconductor light emitting element at a position of a unit pixel of green color. Only the blue semiconductor light emitting element may be used alone in the portion constituting the unit pixel of blue color. In this case, unit pixels of red (R), green (G), and blue (B) may constitute one pixel. More specifically, a phosphor of one color may be laminated along each line of the first electrode 120. Accordingly, one line on the first electrode 120 may be an electrode for controlling one color. That is, red (R), green (G), and blue (B) may be sequentially disposed along the second electrode 140, thereby implementing a unit pixel.

However, embodiments of the present disclosure are not limited thereto. Unit pixels of red (R), green (G), and blue (B) may be implemented by combining the semiconductor light emitting element 150 and the quantum dot (QD) rather than using the phosphor.

Also, a black matrix 191 may be disposed between the phosphor conversion layers to improve contrast. That is, the black matrix 191 may improve contrast of light and darkness.

However, embodiments of the present disclosure are not limited thereto, and anther structure may be applied to implement blue, red, and green colors.

Referring to FIG. 5A, each semiconductor light emitting element may be implemented as a high-power light emitting device emitting light of various colors including blue by using gallium nitride (GaN) as a main material and adding indium (In) and/or aluminum (Al).

In this case, each semiconductor light emitting element may be a red, green, or blue semiconductor light emitting element to form a unit pixel (sub-pixel). For example, red, green, and blue semiconductor light emitting elements R, G, and B may be alternately disposed, and unit pixels of red, green, and blue may constitute one pixel by the red, green and blue semiconductor light emitting elements. Thereby, a full-color display may be implemented.

Referring to FIG. 5B, the semiconductor light emitting element 150a may include a white light emitting device W having a yellow phosphor conversion layer, which is provided for each device. In this case, in order to form a unit pixel, a red phosphor conversion layer 181, a green phosphor conversion layer 182, and a blue phosphor conversion layer 183 may be disposed on the white light emitting device W. In addition, a unit pixel may be formed using a color filter repeating red, green, and blue on the white light emitting device W.

Referring to FIG. 5C, a red phosphor conversion layer 181, a green phosphor conversion layer 185, and a blue phosphor conversion layer 183 may be provided on a ultraviolet light emitting device. Not only visible light but also ultraviolet (UV) light may be used in the entire region of the semiconductor light emitting element. In an embodiment, UV may be used as an excitation source of the upper phosphor in the semiconductor light emitting element.

Referring back to this example, the semiconductor light emitting element is positioned on the conductive adhesive layer to constitute a unit pixel in the display device. Since the semiconductor light emitting element has excellent luminance, individual unit pixels may be configured despite even when the semiconductor light emitting element has a small size.

Regarding the size of such an individual semiconductor light emitting element, the length of each side of the device may be, for example, 80 μm or less, and the device may have a rectangular or square shape. When the semiconductor light emitting element has a rectangular shape, the size thereof may be less than or equal to 20 μm×80 μm.

In addition, even when a square semiconductor light emitting element having a side length of 10 μm is used as a unit pixel, sufficient brightness to form a display device may be obtained.

Therefore, for example, in case of a rectangular pixel having a unit pixel size of 600 μm×300 μm (i.e., one side by the other side), a distance of a semiconductor light emitting element becomes sufficiently long relatively.

Thus, in this case, it is able to implement a flexible display device having high image quality over HD image quality.

The above-described display device using the semiconductor light emitting element may be prepared by a new fabricating method. Such a fabricating method will be described with reference to FIG. 6 as follows.

Figure 6:
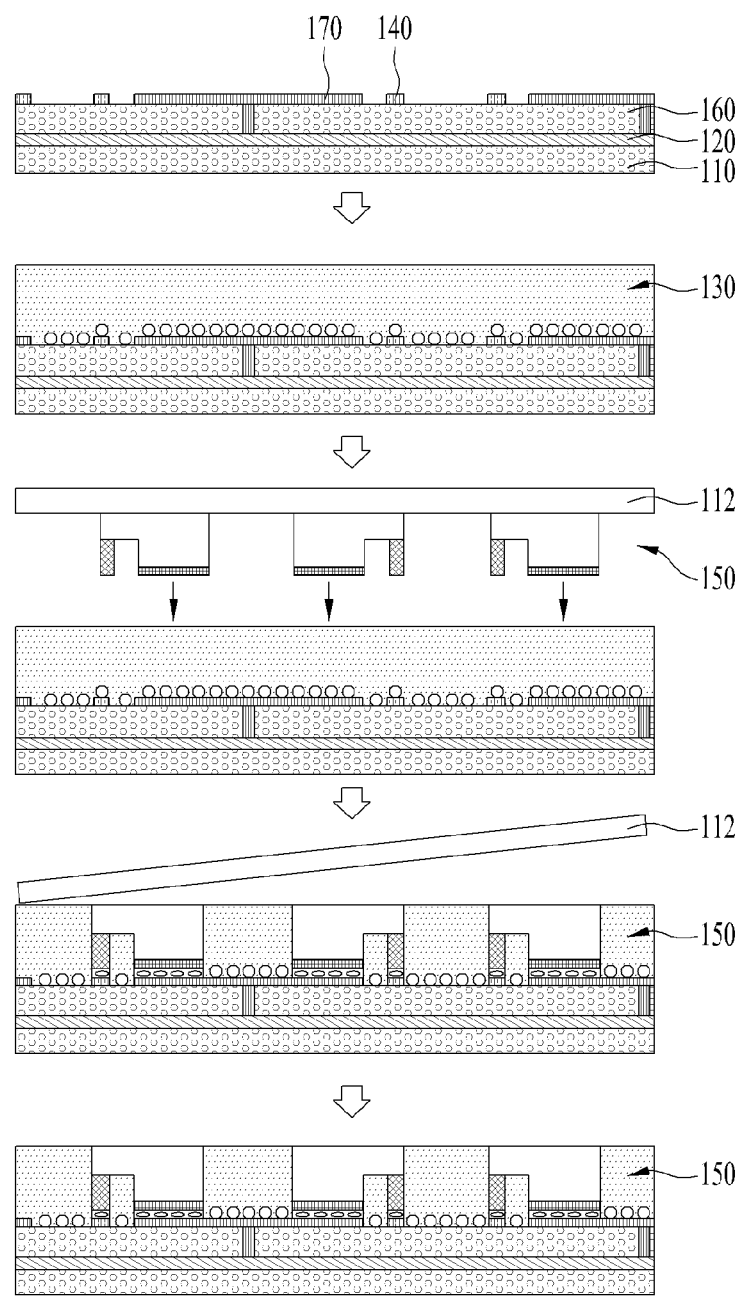
FIG. 6 shows cross-sectional views of a method for fabricating a display device using a semiconductor light emitting element according to the present disclosure.

FIG. 6 shows cross-sectional views of a method of fabricating a display device using a semiconductor light emitting element according to the present disclosure.

Referring to FIG. 6, first of all, a conductive adhesive layer 130 is formed on an insulating layer 160 located between an auxiliary electrode 170 and a second electrode 140. The insulating layer 160 is tacked on a wiring substrate 110. On the wiring substrate 110, a first electrode 120, the auxiliary electrode 170 and the second electrode 140 are disposed. In this case, the first electrode 120 and the second electrode 140 may be disposed in mutually orthogonal directions, respectively. In order to implement a flexible display device, the wiring substrate 110 and the insulating layer 160 may include glass or polyimide (PI) each.

For example, the conductive adhesive layer 130 may be implemented by an anisotropic conductive film. To this end, an anisotropic conductive film may be coated on the substrate on which the insulating layer 160 is located.

Subsequently, a temporary substrate 112, on which a plurality of semiconductor light emitting elements 150 configuring individual pixels are located to correspond to locations of the auxiliary electrode 170 and the second electrodes 140, is disposed in a manner that the semiconductor light emitting element 150 confronts the auxiliary electrode 170 and the second electrode 140.

In this regard, the temporary 112 substrate 112 is a growing substrate for growing the semiconductor light emitting element 150 and may include a sapphire or silicon substrate.

The semiconductor light emitting element is configured to have a space and size for configuring a display device when formed in unit of wafer, thereby being effectively used for the display device.

Subsequently, the wiring substrate 110 and the temporary substrate 112 are thermally compressed together. By the thermocompression, the wiring substrate 110 and the temporary substrate 112 are bonded together. Owing to the property of an anisotropic conductive film having conductivity by thermocompression, only a portion among the semiconductor light emitting element 150, the auxiliary electrode 170 and the second electrode 140 has conductivity, via which the electrodes and the semiconductor light emitting element 150 may be connected electrically. In this case, the semiconductor light emitting element 150 is inserted into the anisotropic conductive film, by which a partition may be formed between the semiconductor light emitting elements 150.

Then the temporary substrate 112 is removed. For example, the temporary substrate 112 may be removed using Laser Lift-Off (LLO) or Chemical Lift-Off (CLO).

Finally, by removing the temporary substrate 112, the semiconductor light emitting elements 150 exposed externally. If necessary, the wiring substrate 110 to which the semiconductor light emitting elements 150 are coupled may be coated with silicon oxide (SiOx) or the like to form a transparent insulating layer (not shown).

In addition, a step of forming a phosphor layer on one side of the semiconductor light emitting element 150 may be further included. For example, the semiconductor light emitting element 150 may include a blue semiconductor light emitting element emitting Blue (B) light, and a red or green phosphor for converting the blue (B) light into a color of a unit pixel may form a layer on one side of the blue semiconductor light emitting element.

The above-described fabricating method or structure of the display device using the semiconductor light emitting element may be modified into various forms. For example, the above-described display device may employ a vertical semiconductor light emitting element.

Furthermore, a modification or embodiment described in the following may use the same or similar reference numbers for the same or similar configurations of the former example and the former description may apply thereto.

Figure 7:
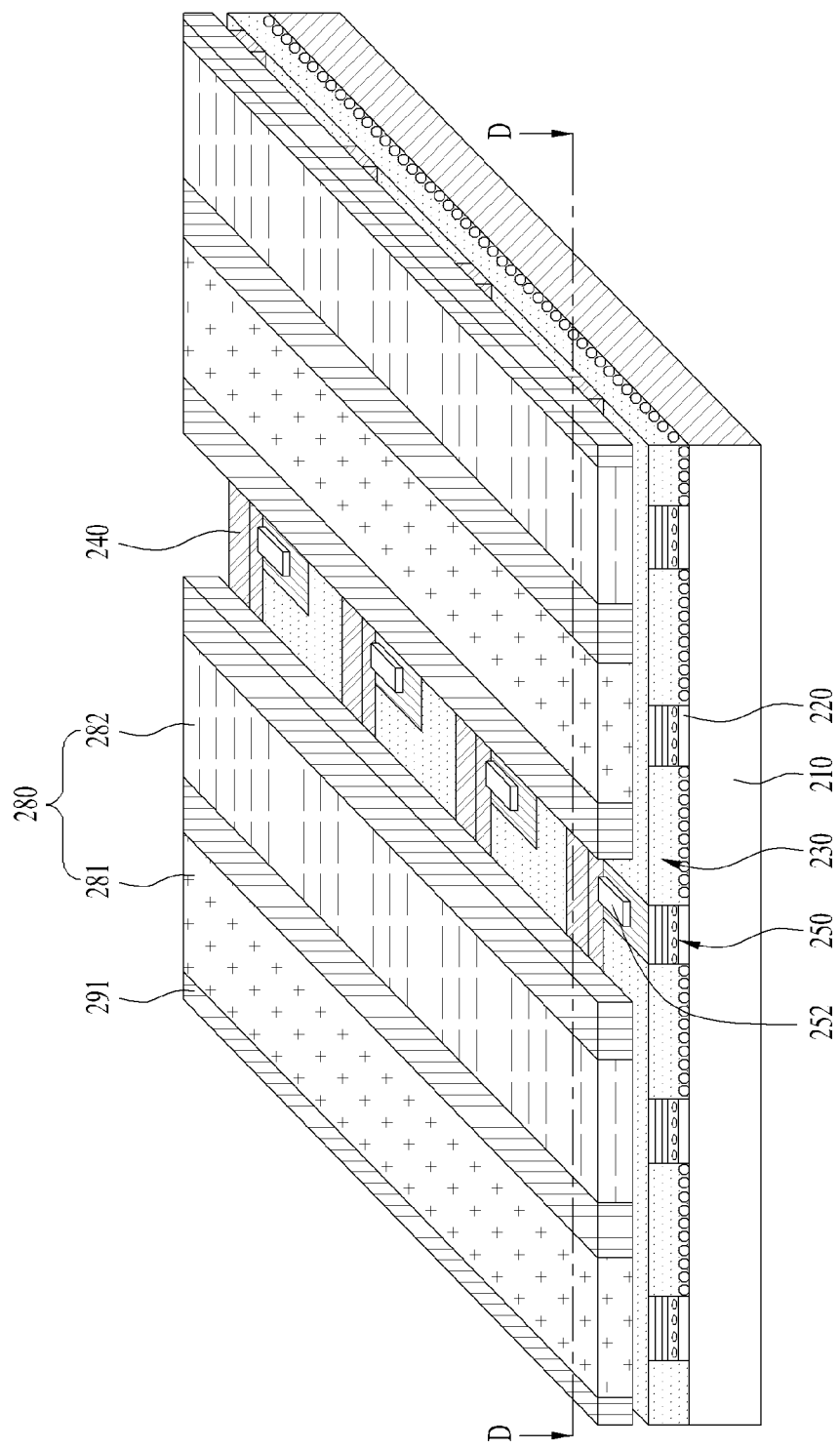
FIG. 7 is a perspective diagram of a display device using a semiconductor light emitting element according to another embodiment of the present disclosure.
Figure 8:
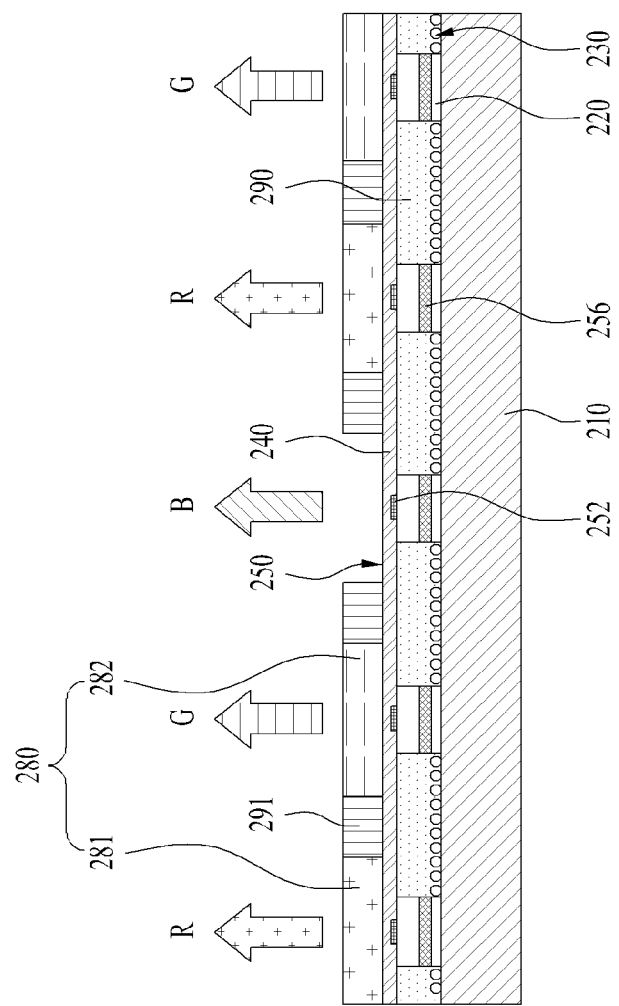
FIG. 8 is a cross-sectional diagram taken along a cutting line D-D shown in FIG. 8.
Figure 9:
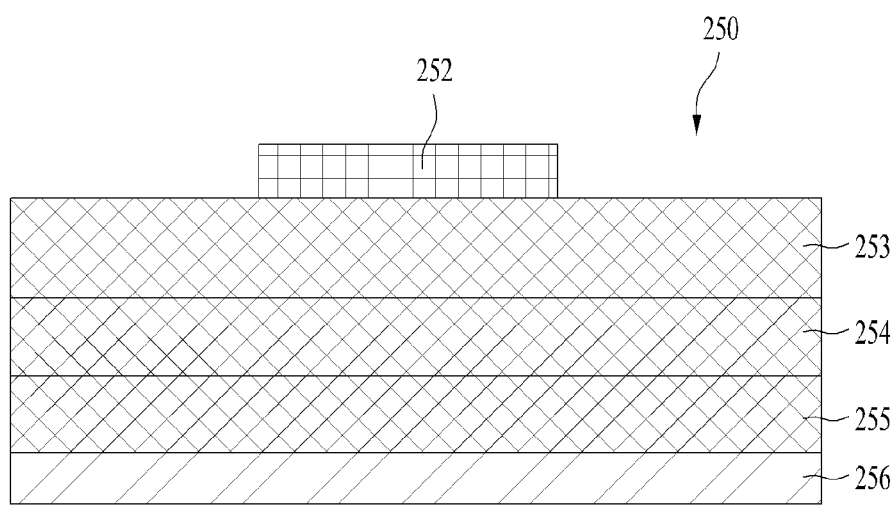
FIG. 9 is a conceptual diagram showing a vertical type semiconductor light emitting element shown in FIG. 8.

FIG. 7 is a perspective diagram of a display device using a semiconductor light emitting element according to another embodiment of the present disclosure, FIG. 8 is a cross-sectional diagram taken along a cutting line D-D shown in FIG. 8, and FIG. 9 is a conceptual diagram showing a vertical type semiconductor light emitting element shown in FIG. 8.

Referring to the present drawings, a display device may employ a vertical semiconductor light emitting device of a Passive Matrix (PM) type.

The display device includes a substrate 210, a first electrode 220, a conductive adhesive layer 230, a second electrode 240 and at least one semiconductor light emitting element 250.

The substrate 210 is a wiring substrate on which the first electrode 220 is disposed and may contain polyimide (PI) to implement a flexible display device. Besides, the substrate 210 may use any substance that is insulating and flexible.

The first electrode 210 is located on the substrate 210 and may be formed as a bar type electrode that is long in one direction. The first electrode 220 may be configured to play a role as a data electrode.

The conductive adhesive layer 230 is formed on the substrate 210 where the first electrode 220 is located. Like a display device to which a light emitting device of a flip chip type is applied, the conductive adhesive layer 230 may include one of an Anisotropic Conductive Film (ACF), an anisotropic conductive paste, a conductive particle contained solution and the like. Yet, in the present embodiment, a case of implementing the conductive adhesive layer 230 with the anisotropic conductive film is exemplified.

After the conductive adhesive layer has been placed in the state that the first electrode 220 is located on the substrate 210, if the semiconductor light emitting element 250 is connected by applying heat and pressure thereto, the semiconductor light emitting element 250 is electrically connected to the first electrode 220. In doing so, the semiconductor light emitting element 250 is preferably disposed to be located on the first electrode 220.

If heat and pressure is applied to an anisotropic conductive film, as described above, since the anisotropic conductive film has conductivity partially in a thickness direction, the electrical connection is established. Therefore, the anisotropic conductive film is partitioned into a conductive portion and a non-conductive portion.

Furthermore, since the anisotropic conductive film contains an adhesive component, the conductive adhesive layer 230 implements mechanical coupling between the semiconductor light emitting element 250 and the first electrode 220 as well as mechanical connection.

Thus, the semiconductor light emitting element 250 is located on the conductive adhesive layer 230, via which an individual pixel is configured in the display device. As the semiconductor light emitting element 250 has excellent luminance, an individual unit pixel may be configured in small size as well. Regarding a size of the individual semiconductor light emitting element 250, a length of one side may be equal to or smaller than 80 μm for example and the individual semiconductor light emitting element 250 may include a rectangular or square element. For example, the rectangular element may have a size equal to or smaller than 20 μm×80 μm.

The semiconductor light emitting element 250 may have a vertical structure.

Among the vertical type semiconductor light emitting elements, a plurality of second electrodes 240 respectively and electrically connected to the vertical type semiconductor light emitting elements 250 are located in a manner of being disposed in a direction crossing with a length direction of the first electrode 220.

Referring to FIG. 9, the vertical type semiconductor light emitting element 250 includes a p-type electrode 256, a p-type semiconductor layer 255 formed on the p-type electrode 256, an active layer 254 formed on the p-type semiconductor layer 255, an n-type semiconductor layer 253 formed on the active layer 254, and an n-type electrode 252 formed on then-type semiconductor layer 253. In this case, the p-type electrode 256 located on a bottom side may be electrically connected to the first electrode 220 by the conductive adhesive layer 230, and the n-type electrode 252 located on a top side may be electrically connected to a second electrode 240 described later. Since such a vertical type semiconductor light emitting element 250 can dispose the electrodes at top and bottom, it is considerably advantageous in reducing a chip size.

Referring to FIG. 8 again, a phosphor layer 280 may formed on one side of the semiconductor light emitting element 250. For example, the semiconductor light emitting element 250 may include a blue semiconductor light emitting element 251 emitting blue (B) light, and a phosphor layer 280 for converting the blue (B) light into a color of a unit pixel may be provided. In this regard, the phosphor layer 280 may include a red phosphor 281 and a green phosphor 282 configuring an individual pixel.

Namely, at a location of configuring a red unit pixel, the red phosphor 281 capable of converting blue light into red (R) light may be stacked on a blue semiconductor light emitting element. At a location of configuring a green unit pixel, the green phosphor 282 capable of converting blue light into green (G) light may be stacked on the blue semiconductor light emitting element. Moreover, the blue semiconductor light emitting element may be singly usable for a portion that configures a blue unit pixel. In this case, the unit pixels of red (R), green (G) and blue (B) may configure a single pixel.

Yet, the present disclosure is non-limited by the above description. In a display device to which a light emitting element of a flip chip type is applied, as described above, a different structure for implementing blue, red and green may be applicable.

Regarding the present embodiment again, the second electrode 240 is located between the semiconductor light emitting elements 250 and connected to the semiconductor light emitting elements electrically. For example, the semiconductor light emitting elements 250 are disposed in a plurality of columns, and the second electrode 240 may be located between the columns of the semiconductor light emitting elements 250.

Since a distance between the semiconductor light emitting elements 250 configuring the individual pixel is sufficiently long, the second electrode 240 may be located between the semiconductor light emitting elements 250.

The second electrode 240 may be formed as an electrode of a bar type that is long in one direction and disposed in a direction vertical to the first electrode.

In addition, the second electrode 240 and the semiconductor light emitting element 250 may be electrically connected to each other by a connecting electrode protruding from the second electrode 240. Particularly, the connecting electrode may include a n-type electrode of the semiconductor light emitting element 250. For example, the n-type electrode is formed as an ohmic electrode for ohmic contact, and the second electrode covers at least one portion of the ohmic electrode by printing or deposition. Thus, the second electrode 240 and the n-type electrode of the semiconductor light emitting element 250 may be electrically connected to each other.

Referring to FIG. 8 again, the second electrode 240 may be located on the conductive adhesive layer 230. In some cases, a transparent insulating layer (not shown) containing silicon oxide (SiOx) and the like may be formed on the substrate 210 having the semiconductor light emitting element 250 formed thereon. If the second electrode 240 is placed after the transparent insulating layer has been formed, the second electrode 240 is located on the transparent insulating layer. Alternatively, the second electrode 240 may be formed in a manner of being spaced apart from the conductive adhesive layer 230 or the transparent insulating layer.

If a transparent electrode of Indium Tin Oxide (ITO) or the like is sued to place the second electrode 240 on the semiconductor light emitting element 250, there is a problem that ITO substance has poor adhesiveness to an n-type semiconductor layer. Therefore, according to the present disclosure, as the second electrode 240 is placed between the semiconductor light emitting elements 250, it is advantageous in that a transparent electrode of ITO is not used. Thus, light extraction efficiency can be improved using a conductive substance having good adhesiveness to an n-type semiconductor layer as a horizontal electrode without restriction on transparent substance selection.

Referring to FIG. 8 again, a partition 290 may be located between the semiconductor light emitting elements 250. Namely, in order to isolate the semiconductor light emitting element 250 configuring the individual pixel, the partition 290 may be disposed between the vertical type semiconductor light emitting elements 250. In this case, the partition 290 may play a role in separating the individual unit pixels from each other and be formed with the conductive adhesive layer 230 as an integral part. For example, by inserting the semiconductor light emitting element 250 in an anisotropic conductive film, a base member of the anisotropic conductive film may form the partition.

In addition, if the base member of the anisotropic conductive film is black, the partition 290 may have reflective property as well as a contrast ratio may be increased, without a separate block insulator.

For another example, a reflective partition may be separately provided as the partition 190. The partition 290 may include a black or white insulator depending on the purpose of the display device.

In case that the second electrode 240 is located right onto the conductive adhesive layer 230 between the semiconductor light emitting elements 250, the partition 290 may be located between the vertical type semiconductor light emitting element 250 and the second electrode 240 each. Therefore, an individual unit pixel may be configured using the semiconductor light emitting element 250. Since a distance between the semiconductor light emitting elements 250 is sufficiently long, the second electrode 240 can be placed between the semiconductor light emitting elements 250. And, it may bring an effect of implementing a flexible display device having HD image quality.

In addition, as shown in FIG. 8, a black matrix 291 may be disposed between the respective phosphors for the contrast ratio improvement. Namely, the black matrix 291 may improve the contrast between light and shade.

Figure 10:
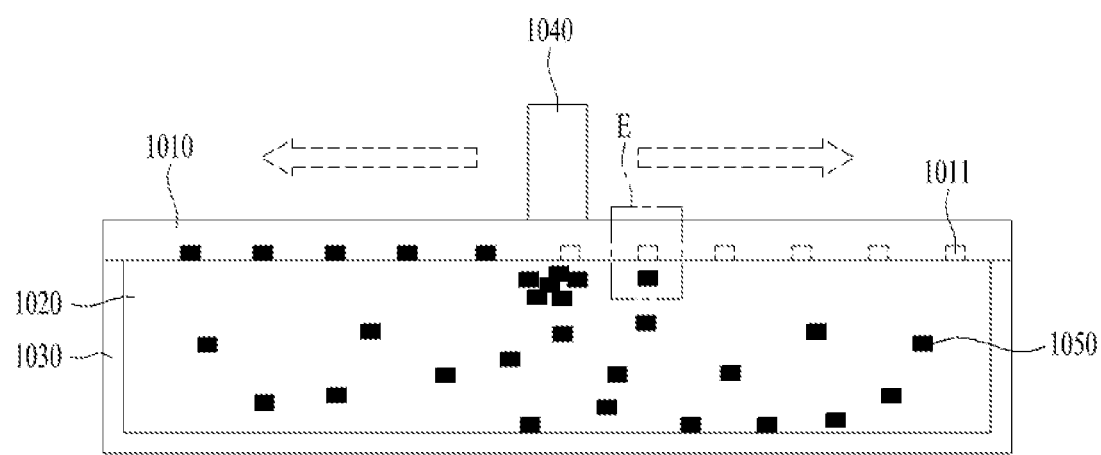
FIG. 10 is a diagram illustrating one embodiment of a method for assembling semiconductor light emitting elements on a substrate through a self-assembly process.

FIG. 10 is a diagram illustrating one embodiment of a method for assembling semiconductor light emitting elements on a substrate through a self-assembly process.

Figure 11:
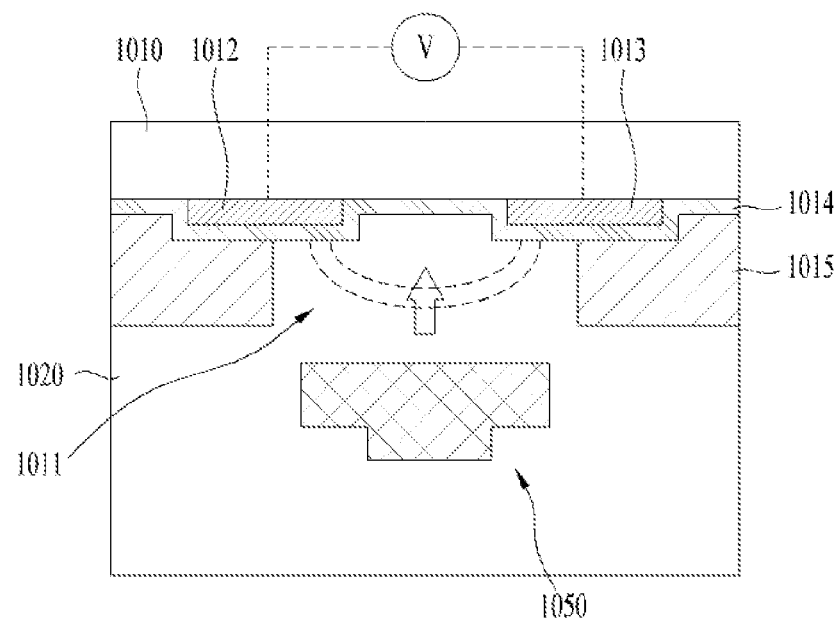
FIG. 11 is an enlarged diagram illustrating a part E shown in FIG. 10.

Further, FIG. 11 is an enlarged diagram illustrating a part E shown in FIG. 10.

Referring to FIGS. 10 and 11, semiconductor light emitting elements 1050 may be put into a chamber 1030 filled with a fluid 1020.

Thereafter, an assembly substrate 1010 may be placed on the chamber 1030. Depending on embodiments, the assembly substrate 1010 may be put into the chamber 1030. Here, the assembly substrate 1010 is put into the chamber 1030 in a direction in which assembly recesses 1011 of the assembly substrate 1010 face the fluid 1020.

A pair of electrodes 1012 and 1013 corresponding to each of the semiconductor light emitting elements 1050 to be assembled may be formed on the assembly substrate 1010. The electrodes 1012 and 1013 may be implemented as transparent electrodes (formed of ITO), or may be implemented using other general materials. The electrodes 1012 and 1013 may generate an electric field by voltage applied thereto, and may thus correspond to assembly electrodes which stably fix the semiconductor light emitting element 1050 coming into contact with the assembly grooves 1012 and 1013.

Specifically, AC voltage may be applied to the electrodes 1012 and 1013, and the semiconductor light emitting element 1050 floating around the electrodes 1012 and 1013 may have polarity due to dielectric polarization. Further, the dielectrically polarized semiconductor light emitting element 1050 may be moved or fixed in a specific direction by a non-uniform electric field formed around the electrodes 1012 and 1013. This may be referred to as dielectrophoresis and, during the self-assembly process according to the present disclosure, the semiconductor light emitting elements 1050 may be stably fixed to the assembly recesses 1011 using dielectrophoresis.

Further, the distance between the assembly electrodes 1012 and 1013 may less than, for example, the width of the light emitting elements 1050 and the diameter of the assembly recesses 1011, and the assembled positions of the semiconductor light emitting elements 1050 using an electric field may be more precisely fixed.

Further, an insulating layer 1014 may be formed on the assembly electrodes 1012 and 1013, and may thus protect the electrodes 1012 and 1013 from the fluid 1020 and prevent leakage of current flowing in the assembly electrodes 1012 and 1013. For example, the insulating layer 1014 may be formed as a single layer or multilayer structure using inorganic insulators, such as silica, alumina, etc., or organic insulators. In addition, the insulating layer 1014 may have a minimum thickness so as to to prevent damage to the assembly electrodes 1012 and 1013 when the semiconductor light emitting elements 1050 are assembled with the assembly electrodes 1012 and 1013, and may have a maximum thickness so as to stably assemble the semiconductor light emitting elements 1050.

A partition 1015 may be formed on the insulting layer 1014. Some regions of the partition 1015 may be located on the assembly electrodes 1012 and 1013, and remaining regions may be located on the assembly substrate 1010.

For example, when the assembly substrate 1010 is manufactured, the assembly recesses 1011 through which the respective semiconductor light emitting elements 1050 are coupled to the assembly substrate 1010 may be formed by removing some parts of the partition 1015 formed on the entirety of the insulating layer 1014.

As shown in FIG. 11, the assembly recesses 1011 to which the semiconductor light emitting elements 1050 are coupled may be formed in the assembly substrate 1010, and the surface of the assembly substrate 1010 on which the assembly recesses 1011 are formed may come into contact with the fluid 1020. The assembly recesses 1011 may accurately guide the semiconductor light emitting elements 1050 to the assembly positions thereof.

Each of the assembly recesses 1011 may have a shape and a size corresponding to the shape of a corresponding one of the semiconductor light emitting elements 1050 assembled therewith. Accordingly, assembly of other semiconductor light emitting elements with the assembly recesses 1011 or assembly of a plurality of semiconductor light emitting elements with one of the assembly recesses 1011 may be prevented.

Further, the depth of the assembly recesses 1011 may be less than the vertical height of the semiconductor light emitting elements 1050. Therefore, the semiconductor light emitting elements 1050 may protrude from the partition 1015, and may easily come into contact with protrusion parts of a transfer substrate during a transfer process after assembly.

Further, when the assembly substrate 1010 is disposed, as shown in FIG. 10, an assembly apparatus 1040 including a magnetic body may be moved along the assembly substrate 1010. The assembly apparatus 1040 may be moved in the state in which the assembly apparatus 1040 comes into contact with the assembly substrate 1010, so as to maximize a region, which a magnetic field affects, up to the inside of the fluid 1020. For example, the assembly apparatus 1040 may include a plurality of magnetic bodies, or may include a magnetic body having a size corresponding to the size of the assembly substrate 1010. In this case, the moving distance of the assembly apparatus 1040 may be restricted to within a designated range.

By the magnetic field generated by the assembly apparatus 1040, the semiconductor light emitting elements 1050 in the chamber 1030 may be moved towards the assembly apparatus 1040.

While the semiconductor light emitting elements 1050 are being moved towards the assembly apparatus 1040, the semiconductor light emitting elements 1050 may enter the assembly recesses 1011, and may come into contact with the assembly substrate 1010, as shown in FIG. 11.

Further, the semiconductor light emitting elements 1050 may include a magnetic layer formed therein so as to perform the self-assembly process.

Due to the electric field generated by the assembly electrodes 1012 and 1013 of the assembly substrate 1010, release of the semiconductor light emitting elements 1050 coming into contact with the assembly substrate 1010 from the assembly substrate 1010 by movement of the assembly apparatus 1040 may be prevented.

Therefore, by the self-assembly method using an electromagnetic field, as shown in FIGS. 10 and 11, the plurality of semiconductor light emitting elements 1050 may be simultaneously assembled on the assembly substrate 1010.

Figure 12:
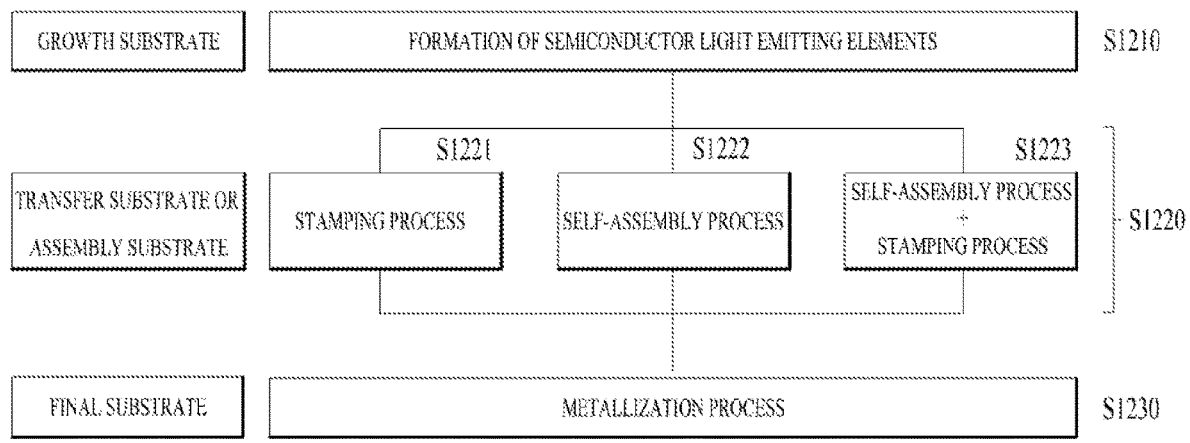
FIG. 12 is a diagram schematically illustrating a method for manufacturing a display device using semiconductor light emitting elements.

FIG. 12 is a diagram schematically illustrating a method for manufacturing a display device using semiconductor light emitting elements.

First, the semiconductor light emitting elements are formed on growth substrates (S1210). Each of the semiconductor light emitting elements may include a first conductivity-type semiconductor layer, an active layer and a second conductivity-type semiconductor layer. Each of the semiconductor light emitting elements may further include a first conductivity-type electrode formed on the first conductivity-type semiconductor layer and a second conductivity-type electrode formed on the second conductivity-type semiconductor layer.

The semiconductor light emitting elements may be lateral semiconductor light emitting elements or vertical semiconductor light emitting elements and, when the semiconductor light emitting elements are vertical semiconductor light emitting elements, the first conductivity-type electrode and the second conductivity-type electrode face each other, and thus, a process of separating the semiconductor light emitting elements from the growth substrate and then forming one conductivity-type electrode on one end of each of the semiconductor light emitting elements is added. Further, as described above, the semiconductor light emitting elements may include a magnetic layer so as to perform the self-assembly process.

In order to apply the semiconductor light emitting elements to a display device, in general, three kinds of semiconductor light emitting elements configured to emit light of red, green and blue are necessary. Since semiconductor light emitting elements configured to emit light of one color are formed on one growth substrate, separate substrates are required to manufacture the display device which implements respective unit pixels using the above three kinds of semiconductor light emitting elements. Therefore, the respective semiconductor light emitting elements need to be separated from the growth substrates and then be assembled on or transferred to a final substrate. The final substrate is a substrate on which a process of forming wired electrodes applying voltage to the semiconductor light emitting elements so as to enable the semiconductor light emitting elements to emit light is performed.

Therefore, the semiconductor light emitting elements configured to emit light of respective colors may be moved to a transfer substrate or an assembly substrate (S1220), and may be finally transferred to the final substrate. In some cases, when a metallization process is performed on the transfer substrate or the assembly substrate, the transfer substrate or the assembly substrate may serve as the final substrate.

The semiconductor light emitting elements may be arranged on the transfer substrate or the assembly substrate by the following three methods (S1220).

First, the semiconductor light emitting elements may be transferred from the growth substrate to the transfer substrate by a stamping process (S1221). The stamping process indicates a process in which semiconductor light emitting elements are separated from a growth substrate using a substrate which is formed of a flexible material and has protrusions having adhesive strength, through the protrusions. The semiconductor light emitting elements may be selectively separated from the growth substrate by controlling the interval between the protrusions and the arrangement of the protrusions.

Second, the semiconductor light emitting elements may be assembled with the assembly substrate using the self-assembly process, as described above (S1222). In order to perform the self-assembly process, the semiconductor light emitting elements should be separated from the growth substrate so as to be prepared individually, and thus, a number of the semiconductor light emitting elements corresponding to the number needed are separated from the growth substrates through a Laser Lift Off (LLO) process. Thereafter, the semiconductor light emitting elements are dispersed in the fluid, and are assembled on the assembly substrate using the electromagnetic field.

In the self-assembly process, the respective semiconductor light emitting elements configured to implement light of R, G and B may be simultaneously assembled on one assembly substrate, or the semiconductor light emitting elements configured to implement light of the respective colors may be assembled through respective assembly substrates.

Third, both the stamping process and the self-assembly process may be used (S1223). First, the semiconductor light emitting elements are located on the assembly substrate through the self-assembly process, and then, the semiconductor light emitting elements are transferred to the final substrate through the stamping process. Since it is difficult to implement a large-area assembly substrate due to the position of the assembly substrate disposed during the self-assembly process, contact with the fluid, the effect of the electromagnetic field, etc., the semiconductor light emitting elements may be assembled with an assembly substrate having an appropriate area and then the semiconductor light emitting elements on the assembly substrate are transferred to a final substrate having a large area plural times through the stamping process.

When the plurality of semiconductor light emitting elements configured to form respective unit pixels is arranged on the final substrate, the metallization process in which the semiconductor light emitting elements are conductively interconnected is performed (S1230).

In order to implement a large-scale display device, a large number of semiconductor light emitting elements is required, and thus, the self-assembly process is desirable. Further, in order to improve the assembly speed, simultaneous assembly of the semiconductor light emitting elements configured to emit light of respective colors with one assembly substrate may be preferred during the self-assembly process. Further, in order to assemble the semiconductor light emitting elements configured to emit light of the respective colors with designated specific positions of the assembly substrate, the semiconductor light emitting elements may require mutually exclusive structures.

Figure 13:
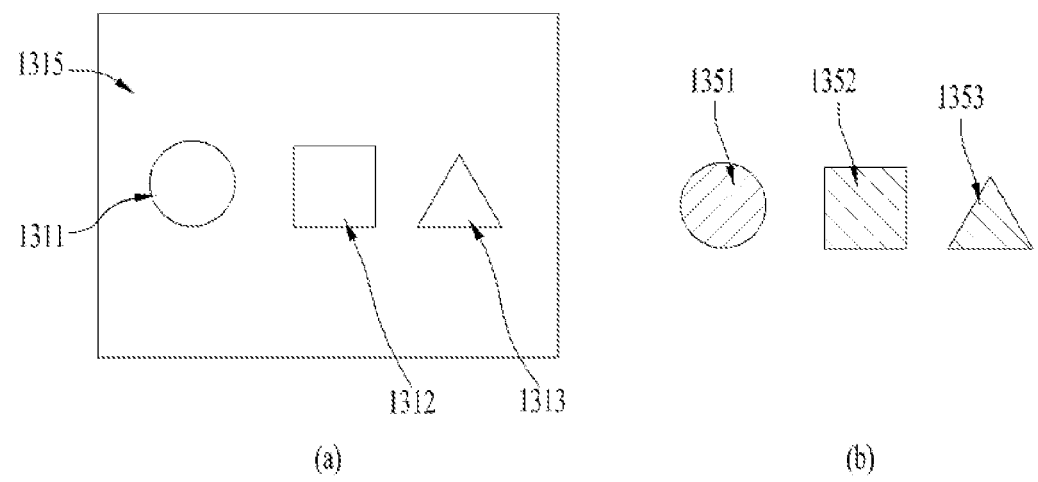
FIG. 13 shows views illustrating a general substrate structure and semiconductor light emitting elements having a plurality of shapes so as to simultaneously assemble the semiconductor light emitting elements on the substrate.

FIG. 13 shows views illustrating a general substrate structure and semiconductor light emitting elements having a plurality of shapes so as to simultaneously assemble the semiconductor light emitting elements with the substrate.

FIG. 13(a) illustrates assembly recesses 1311, 1312 and 1313 corresponding to the semiconductor light emitting elements having the plurality of shapes. The assembly recesses 1311, 1312 and 1313 are defined as being surrounded by a partition 1315.

FIG. 13(b) illustrates semiconductor light emitting elements 1351, 1352 and 1353 corresponding to the assembly recesses 1311, 1312 and 1313 of FIG. 13(a).

The respective semiconductor light emitting elements 1351, 1352 and 1353 are not assembled with assembly recesses other than assembly recesses having the corresponding shapes. For example, the circular semiconductor light emitting element 1351 may be assembled with only the circular assembly recess 1311, and the equilateral triangle semiconductor light emitting element 1353 may be assembled with only the equilateral triangle assembly recess 1313. However, since the circular semiconductor light emitting element 1351 has continuous symmetric points even though it is rotated in the clockwise or counterclockwise direction about the central point of the circular semiconductor light emitting element 1351, the circular semiconductor light emitting element 1351 may be immediately assembled with the circular assembly recess 1311 only when the circular semiconductor light emitting element 1351 is located on the circular assembly recess 1311.

However, for example, when the equilateral triangle semiconductor light emitting element 1353 is located on the equilateral triangle assembly recess 1313, there is not a great possibility that the equilateral triangle semiconductor light emitting element 1353 is immediately assembled with the equilateral triangle assembly recess 1313. An equilateral triangle has three vertexes, each vertex has a symmetric axis in a direction connected to the central point of the equilateral triangle, and thus, there are symmetric axes in three directions. That is, the equilateral triangle implements the same shape only when it is rotated at an angle of 120 degrees or 240 degrees about the central point of the equilateral triangle. Therefore, although the equilateral triangle semiconductor light emitting element 1353 is located on the equilateral triangle assembly recess 1313, when the positions of the vertexes of the equilateral triangle semiconductor light emitting element 1353 are different from the positions of the vertexes of the equilateral triangle assembly recess 1313, the equilateral triangle semiconductor light emitting element 1353 is not immediately assembled with the equilateral triangle assembly recess 1313 and requires separate positional change.

Similarly, the square semiconductor light emitting element 1352 has four vertexes or four symmetric axes, and thus, when the positions of the vertexes of the square semiconductor light emitting element 1352 are different from the positions of the vertexes of the square triangle assembly recess 1312, the square semiconductor light emitting element 1352 is not immediately assembled with the square triangle assembly recess 1312 and requires separate positional change. Further, in the case in which the semiconductor light emitting elements 1352 and 1353 have a simply rectangular or triangular shape other than a square or equilaterally triangular shape, there may be no symmetric axis, and thus, positional changes may be required to accurately assemble the semiconductor light emitting elements 1352 and 1353 with the assembly recesses 1312 and 1313, and an assembly time thereby may be added.

As described above, in order to implement a large-scale display device, a large number of semiconductor light emitting elements rather than a small number of semiconductor light emitting elements is required. Therefore, design and assembly of the semiconductor light emitting elements through general structural differences are necessary to be improved in terms of assembly efficiency and speed.

Figure 14:
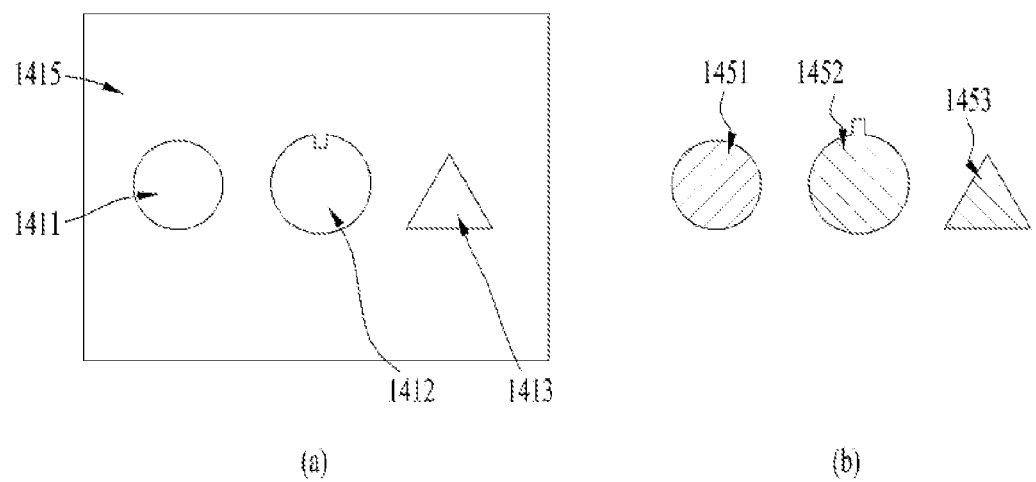
FIG. 14 shows views illustrating a substrate structure and semiconductor light emitting elements having a plurality of shapes according to the present disclosure so as to simultaneously assemble the semiconductor light emitting elements on the substrate.

FIG. 14 shows views illustrating a substrate structure and semiconductor light emitting elements having a plurality of shapes according to the present disclosure so as to simultaneously assemble the semiconductor light emitting elements with the substrate.

The respective semiconductor light emitting elements emit light of different colors depending on the shapes thereof.

FIG. 14(*a*) illustrates assembly recesses 1411, 1412 and 1413 corresponding to the semiconductor light emitting elements having the plurality of shapes. The assembly recesses 1411, 1412 and 1413 are defined as being surrounded by a partition 1415.

FIG. 14(*b*) illustrates semiconductor light emitting elements 1451, 1452 and 1453 corresponding to the assembly recesses 1411, 1412 and 1413 of FIG. 14(*a*).

As described above, the circular semiconductor light emitting element 1451 has continuous symmetric points even though it is rotated in the clockwise or counterclockwise direction about the central point of the circular semiconductor light emitting element 1451, and the circular semiconductor light emitting element 1451 is immediately assembled with the circular assembly recess 1411 only when the circular semiconductor light emitting element 1451 is located at the central point of the circular assembly recess 1311. Therefore, the circular semiconductor light emitting element 1451 has a much higher assembly speed than the semiconductor light emitting element 1452 and 1453 having other shapes.

However, in the case in which semiconductor light emitting elements configured to emit light of one color have a circular shape, semiconductor light emitting elements configured to emit light of other colors cannot have a circular shape. Although circular semiconductor light emitting elements have different sizes and circular assembly recesses corresponding thereto are provided, when self-assembly is performed, the circular semiconductor light emitting element having a small size may be assembled with the assembly recess having a large size. In this case, color mixing occurs and causes difficulty in implementing light of red (R), green (G) and blue (B) using the unit pixels, it is difficult to display a desired color, and thus, a defect may be caused. Further, a semiconductor light emitting element having many symmetric axes other than a circular structure, for example, an octagonal semiconductor light emitting element, may be assembled with a circular assembly recess corresponding to a circular semiconductor light emitting element configured to emit light of a different color, or the circular semiconductor light emitting element may be assembled with an octagonal assembly recess.

Therefore, in addition to the shape having various symmetric axes based on the central point of the assembly recess, design of a new shape is required.

The assembly recess 1412 of FIG. 14(*a*) and the semiconductor light emitting element 1452 of FIG. 14(*b*) have shapes which have an exclusive structure from the circular semiconductor light emitting element while maintaining the assembly speed exhibited by the circular semiconductor light emitting element as fast as possible.

As shown in FIG. 14(*a*), the assembly recess 1412 is defined as being surrounded by the partition 1415, has an overall circular shape, and is provided with a protrusion part formed at a part of the partition 1415 so as to protrude towards the inside of the assembly recess 1412.

Further, as shown in FIG. 14(*b*), the semiconductor light emitting element 1452 assembled with the assembly recess 1412 according to the present disclosure has an overall circular shape, and includes a bump part protruding in the lateral direction of the surface of the semiconductor light emitting element 1452 to be assembled.

In comparison between the semiconductor light emitting element 1452 and the circular semiconductor light emitting element 1451, the diameter of the circular semiconductor light emitting element 1451 may be greater than the minimum width of the assembly recess 1412 according to the present disclosure so that it is difficult to assemble the circular semiconductor light emitting element 1451 with the assembly recess 1412 according to the present disclosure. Here, the minimum width of the assembly recess 1412 according to the present disclosure indicates a straight distance from the end of the protrusion part protruding towards the inside of the assembly recess 1412 to the opposite side of the assembly recess 1412.

Further, the maximum diameter of the semiconductor light emitting element 1452 including the bump part according to the present disclosure may be greater than the diameter of the circular assembly recess 1411 so that it is difficult to assemble the semiconductor light emitting element 1452 with the circular assembly recess 1411. Therefore, the two light emitting elements 1451 and 1452 may have mutually exclusive structures, and may be assembled with only the corresponding assembly recesses 1411 and 1412.

The equilateral triangular semiconductor light emitting element 1453 and the assembly recess 1413 corresponding thereto, as shown in FIGS. 14(*a*) and 14(*b*), are only an example configured to express semiconductor light emitting elements having various shapes. Therefore, the substrate structure and the shapes of the semiconductor light emitting elements according to the present disclosure are not limited thereto. For example, in order to assemble semiconductor light emitting elements having three shapes configured to emit light of the three primary colors, i.e., red (R), green (G) and blue (B), on one substrate, a circular semiconductor light emitting element, a first-type circular semiconductor light emitting elements including a bump part on the side surface thereof, and a second-type circular semiconductor light emitting element including a bump part on the side surface thereof may be required. The semiconductor light emitting elements including the bump part and assembly recesses corresponding thereto may be exclusively assembled by controlling the maximum widths and the minimum widths thereof. The reason why the circular semiconductor light emitting elements including the bump part are used is that the circular semiconductor light emitting elements including the bump part may be mutually exclusively assembled with the corresponding assembly recesses without a big difference in assembly speed with the conventional circular semiconductor light emitting element. The more detailed effects of the circular semiconductor light emitting elements including the bump part will be described later with reference to FIG. 17.

Figure 15:
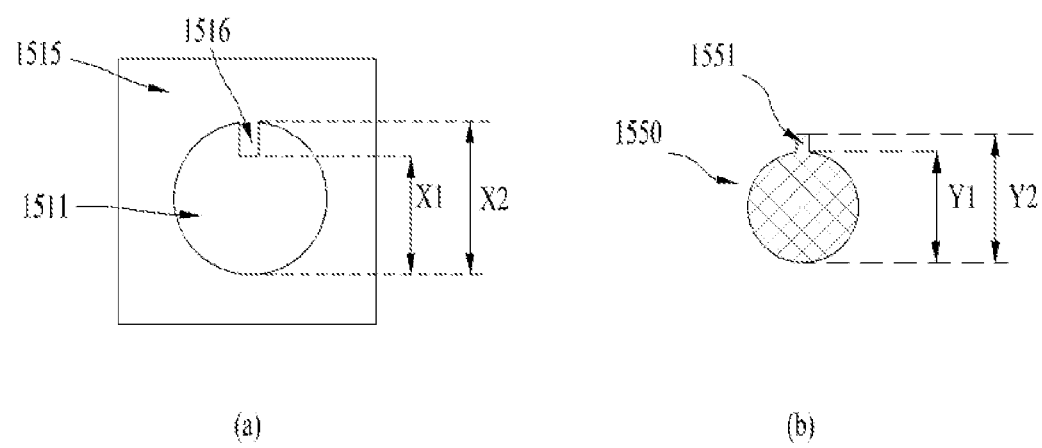
FIG. 15 shows views illustrating a substrate structure and the shape of a semiconductor light emitting element according to the present disclosure.

FIG. 15 shows views illustrating a substrate structure and the shape of a semiconductor light emitting element according to the present disclosure.

As shown in FIG. 15(*a*), an assembly recess 1511 with which a semiconductor light emitting element is assembled may be defined by a partition 1515. Further, the partition 1515 may include a protrusion part 1516 which protrudes towards the inside of the assembly recess 1411. Further, the assembly recess 1511 other than the protrusion part 1516 may have a circular shape. Therefore, the minimum width X1 or the minimum breath of the assembly recess 1511 corresponds to a distance between a straight line extending perpendicularly from the protrusion part 1516 and the opposite side of the assembly recess 1511. Further, the maximum width X2 or the maximum breath of the assembly recess 1511 corresponds to the diameter of the circular assembly recess 1511.

Further, as shown in FIG. 15(*b*), a semiconductor light emitting element 1550 assembled with the assembly recess 1511 includes a bump part 1511 protruding in the lateral direction. Further, the semiconductor light emitting element 1550 other than the bump part 1511 may have a circular shape. Therefore, the minimum width Y1 of the semiconductor light emitting element 1550 corresponds to the diameter of the semiconductor light emitting element 1550, and the maximum width Y2 of the semiconductor light emitting element 1550 corresponds to a distance between a straight line extending perpendicularly from the bump part and the opposite side of the semiconductor light emitting element 1550.

Further, in order to assemble the semiconductor light emitting element 1550 with the assembly recess 1511, the following length limits may be required. For example, the minimum width X1 of the assembly recess 1511 may be equal to or greater than the minimum width Y1 of the semiconductor light emitting element 1550. Further, the maximum width X2 of the assembly recess 1511 may be equal to or greater than the maximum width Y2 of the semiconductor light emitting element 1550.

Finally, the maximum width Y2 of the semiconductor light emitting element 1550 may be greater than the minimum width X1 of the assembly recess 1511. For example, when the maximum width Y2 of the semiconductor light emitting element 1550 is smaller than the minimum width X1 of the assembly recess 1511, although the semiconductor light emitting element 1550 is assembled with the assembly recess 1511, there is much clearance inside the assembly recess 1511, and there may be a great possibility that the semiconductor light emitting element moves in the clearance. Thereby, the assembled position of the semiconductor light emitting element 1550 in the assembly recess 1511 is not clearly defined, and thus, it is difficult to form wired electrodes at accurate positions during the subsequent metallization process. However, when the maximum width Y2 of the semiconductor light emitting element 1550 is greater than the minimum width X1 of the assembly recess 1511 and the minimum width X1 of the assembly recess 1511 is similar to the minimum width Y1 of the semiconductor light emitting element 1550, the semiconductor light emitting element 1550 other than the bump part 1551 in the assembly recess 1511 is located inside the minimum width X1 of the assembly recess 1511. Therefore, the assembled position is clearly specified, and thus, the subsequent metallization process may be easily performed.

Further, through the above length limits, the semiconductor light emitting element 1550 may be assembled with the inside of the assembly recess 1511, and may be rotated inside the minimum width X1 of the assembly recess 1511. The reason why the rotational movement is required is due to the process of assembling the semiconductor light emitting element 1550 with the assembly recess 1511 through self-assembly. For example, when the bump part 1551 overlaps the protrusion part 1516 of the partition 1515, the semiconductor light emitting element 1550 may come into stable contact with the bottom surface of the assembly recess 1511 even through slight positional change due to rotation of the bump part 1551.

FIG. 15 illustrates limits on structural characteristics, as seen from the top, when the semiconductor light emitting element 1550 is assembled with the assembly recess 1511, but FIG. 15 does not illustrate limits on the shapes and heights of the bump part 1551 and the protrusion part 1516, as seen through the cross-sections thereof.

Figure 16:
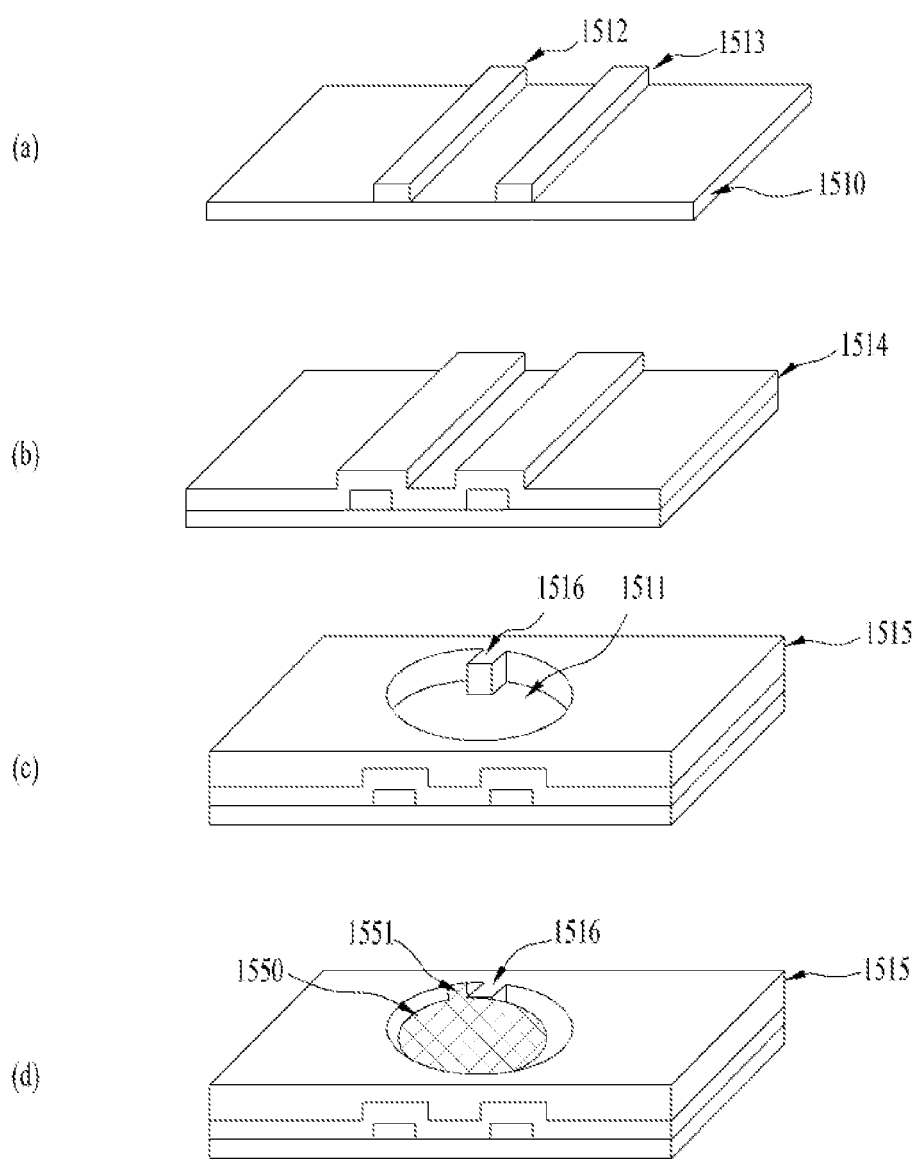
FIG. 16 shows views illustrating a method for manufacturing the substrate structure shown in FIG. 15 and assembly of the semiconductor light emitting element according to the present disclosure on the substrate.

FIG. 16 shows views illustrating a method for manufacturing the substrate structure shown in FIG. 15 and assembly of the semiconductor light emitting element according to the present disclosure on the substrate.

As shown in FIG. 16(*a*), assembly electrodes 1512 and 1513 are formed on a substrate 1510. The substrate 1510 may be a flexible substate. For example, in order to implement a flexible display device, the substrate may include glass or polyimide (PI).

Further, the assembly electrodes 1512 and 1513 may be, for example, transparent electrodes (formed of ITO), and may be implemented as a single molybdenum layer or a multilayer structure using molybdenum and aluminum.

Further, the assembly electrodes 1512 and 1513 are provided in a pair, and there is a voltage difference between the assembly electrodes 1512 and 1513.

The object of formation of the assembly electrodes 1512 and 1513 is to cause dielectrophoresis (DEP) due to an electric field, when self-assembly is performed, so as to fix the semiconductor light emitting element to the assembly recess.

When the assembly electrodes 1512 and 1513 are formed on the substrate, an insulating layer 1514 is deposited on the assembly electrodes 1512 and 1513, as shown in FIG. 16(*b*). As described above, the insulating layer 1514 protects the assembly electrodes 1512 and 1513 from a fluid during the self-assembly process, and prevents occurrence of a leakage current during a process of applying voltage to the assembly electrodes 1512 and 1513.

Thereafter, as shown in FIG. 16(*c*), the assembly recess 1511 is formed in the upper surface of the insulating layer. The assembly recess 1511 is defined as being surrounded by the partition 1515, and is provided with the protrusion part 1516 formed at a part of the partition 1515 so as to protrude towards the inside of the assembly recess 1511.

The partition 1515 and the assembly recess 1511 may be formed through photolithography using a photosensitive material. For example, patterns are formed by first coating the substrate with glass, Spin On Glass (SOG) or a polymer material, then coating the substrate with the photosensitive material, and performing photolithography. Thereafter, the protrusion part 1516 of the partition 1515 and the assembly recess 1511 may be formed by selectively removing the photosensitive material through dry etching or wet etching.

During the process of forming the assembly recess 1511, a metal reflective film may be formed on the bottom of the assembly recess 1511. The metal reflective film may include a plurality of layers having different refractive indexes so as to reflect light emitted downwards from the semiconductor light emitting element. Further, the plurality of layers may be formed by repeatedly stacking a material having a relatively high refractive index and a material having a relatively low refractive index.

Further, an adhesive layer configured to stably fix the semiconductor light emitting element may be formed on the bottom of the assembly recess 1511. The adhesive layer may be formed of, for example, an organic material, such as Polydimethylsiloxane (PDMS), Polyethylene Terephthalate (PET) or a polyurethane film.

Moreover, a metal film configured to shield an electric field may be formed on the bottom of the assembly recess 1511 or the partition 1515 surrounding the assembly recess 1511. The metal film enables the electric field to be concentrated upon only the inside of the assembly recess 1511 during a process of generating the electric field through the assembly electrodes, thereby being capable of improving self-assembly efficiency of the semiconductor light emitting element.

Thereafter, when the self-assembly process is performed, as described above, the semiconductor light emitting element 1550 including the bump part 1551 may be stably assembled with the inside of the assembly recess without overlapping between the bump part 1551 between the protrusion part 1516 of the partition 1515.

The bump part 1551 may be formed by various methods during the growth process of the semiconductor light emitting element. For example, a bump part may be formed by etching a part of a specific conductivity-type semiconductor layer of the semiconductor light emitting element 1550, and a conductivity-type electrode for conductive connection formed on a conductivity-type semiconductor layer may be used as the bump part. Further, a part of a passivation layer configured to protect the semiconductor layers inside of the semiconductor light emitting element 1550 may be deformed so as to be used as the bump part. Therefore, in addition to the above-described formation methods, various formation methods within a scope which those skilled in the art may easily deduce may be construed as being within the scope of the present disclosure.

Further, the semiconductor light emitting element 150 may include a magnetic layer, and the position of the semiconductor light emitting element 1550 coming into contact with the assembly recess may be changed using an assembly apparatus including a magnetic body, which is placed on the rear surface of the assembly substrate. Specifically, the assembly apparatus including the magnetic body may execute rectilinear movement forwards, rearwards, leftwards and rightwards or rotational movement on the rear surface of the substrate. Therefore, semiconductor light emitting elements may be rectilinearly moved forwards, rearwards, leftwards and rightwards or be rotated due to a magnetic field generated by the assembly apparatus.

Although FIG. 16 illustrates a process of assembling the semiconductor light emitting element having a new structure on the assembly substrate, the present disclosure is not limited thereto. As described above, semiconductor light emitting elements configured to emit light of different colors may be assembled on the assembly substrate, and thus, semiconductor light emitting elements having different shapes and assembly recesses corresponding thereto may be additionally provided, and may be assembled with each other.

Wired electrodes may be formed on the semiconductor light emitting element 1550 assembled on the substrate so as to be conductively connected to the substrate.

Further, the substrate may serve as a first substrate, and the semiconductor light emitting element 1550 assembled on the first substrate may be transferred to a second substrate. In this case, the second substrate may be a donor substrate or a transfer substrate for transfer to another substrate, or may be a wiring substrate in which wired electrodes are already formed, or a final substrate. Transistors configured to drive an active matrix may be provided on the final substrate.

Further, such a transfer process may include forming wired electrodes and a conductive adhesive layer on the second substrate, and adhering the first substrate to the conductive adhesive layer so that the semiconductor light emitting element on the first substrate is aligned with the wired electrodes, i.e., an alignment operation.

The alignment operation is performed by, for example, horizontally moving one of the donor substrate and the wiring substrate with respect to the other, and then vertically moving the one with respect to the other. Thereafter, whether or not the position of the semiconductor light emitting element on the donor substrate overlaps the position of the assembly recess in the wiring substrate corresponding to the semiconductor light emitting element is confirmed by a camera sensor or the like, and the semiconductor light emitting element is assembled with the assembly recess upon confirming that the position of the semiconductor light emitting element overlaps the position of the assembly recess.

Figure 17:
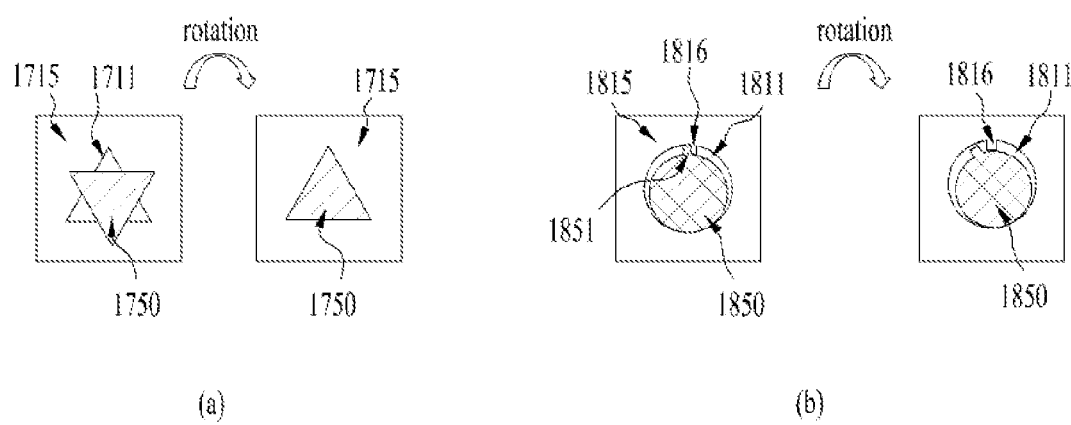
FIG. 17 shows views illustrating the effect of the assembly speed exhibited by the display device according to the present disclosure compared to the conventional display device.

FIG. 17 shows views illustrating the effect of the assembly speed exhibited by the display device according to the present disclosure compared to the conventional display device.

FIG. 17(*a*) illustrates a semiconductor light emitting element 1750 having an equilateral triangular shape and an assembly recess 1711 corresponding thereto. Further, the assembly recess 1711 is defined by a partition 1715.

As shown in FIG. 17(*a*), although the semiconductor light emitting element 1750 is located on the assembly recess 1711, when the directions of the vertexes of the assembly recesses 1711 and the directions of the vertexes of the semiconductor light emitting element 1750 do not coincide with each other, assembly of the semiconductor light emitting element 1750 with the assembly recess 1711 is not completed, and therefore, the semiconductor light emitting element 1750 may be rotated using an assembly apparatus having a magnetic body provided outside a substrate so as to be assembled with the assembly recess 1711. However, the range of the angle of rotation of the semiconductor light emitting element 1750 necessary for assembly is wide. For example, in the arrangement shown in FIG. 17(*a*), the semiconductor light emitting element 1750 may be rotated at an angle of 60 degrees so as to be assembled with the assembly recess 1711.

In the case in which movement, such as rotation, of one semiconductor light emitting element is required, a time taken to achieve assembly is not long, but in the case in which a large number of semiconductor light emitting elements is assembled, the smaller the movement, such as rotation, of the semiconductor light emitting elements, the better.

In this respect, as shown in FIG. 17(*b*), a semiconductor light emitting element 1850 including a bump part 1851 and configured to be assembled with an assembly recess 1811 defined by a partition 1815 having a protrusion part 1816 according to the present disclosure may improve an assembly speed compared to the semiconductor light emitting element 1750 shown in FIG. 17(*b*).

For example, in the arrangement shown in FIG. 17(*b*), when the bump part 1851 of the semiconductor light emitting element 1850 overlaps the protrusion part 1816 of the partition 1815, assembly of the semiconductor light emitting element 1850 with the assembly recess 1811 is not completed. However, the semiconductor light emitting element 1850 may be slightly rotated so as to prevent overlapping between the bump part 1851 and the protrusion part 1816, and may thus be stably assembled with the bottom surface of the assembly recess 1811. The angle of rotation of the semiconductor light emitting element may correspond to a ratio of the length of the bump part coming into contact with the circular semiconductor light emitting element to the circumference of the circular semiconductor light emitting element other than the bump part. Therefore, a much smaller angle of rotation than the angle of 60 degrees shown in FIG. 17(*a*) may be required, and thereby, improvement in the assembly speed may be achieved.

Figure 18:
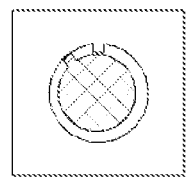
FIG. 18 shows views illustrating various embodiments of the present disclosure.
Figure 18:
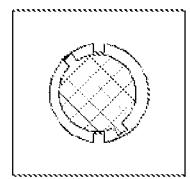
Figure 18:
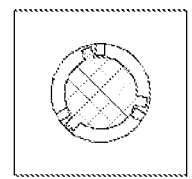

FIG. 18 shows views illustrating various embodiments of the present disclosure.

FIGS. 14 to 17 disclose the semiconductor light emitting element having one bump part and the assembly recess formed by the partition having one protrusion part corresponding to the semiconductor light emitting element according to the present disclosure. However, as shown in FIG. 18, the number of the bump parts and the number of the protrusions may be variously modified. For example, FIG. 18(*a*) illustrates the state in which a semiconductor light emitting element having one bump part is assembled with an assembly recess corresponding thereto, FIG. 18(*b*) illustrates the state in which a semiconductor light emitting element having two bump parts is assembled with an assembly recess corresponding thereto, and FIG. 18(*c*) illustrates the state in which a semiconductor light emitting element having three bump parts is assembled with an assembly recess corresponding thereto. The number of the bump parts and the number of the protrusions may be different, but the bump parts and the protrusions which are provided in the same number are advantageous in terms of assembly.

The above description is merely illustrative of the technical spirit of the present disclosure. It will be apparent to those skilled in the art that various modifications and variations can be made in the present disclosure without departing from the spirit and scope of the disclosure.

Therefore, the embodiments disclosed in the present disclosure are merely illustrative of the technical spirit of the present disclosure. The scope of the technical spirit of the present disclosure is not limited by these embodiments.

The scope of the present disclosure should be construed by the appended claims, and all technical ideas within the scope equivalent thereto should be construed as being within the scope of the present disclosure.

What is claimed is:

1. A display device using semiconductor light emitting elements, the display device comprising:
   a substrate;
   assembly electrodes located on the substrate;
   an insulating layer located on the assembly electrodes;
   a partition located on the insulating layer;
   a first assembly recess defined by the partition; and
   a first semiconductor light emitting element disposed in the first assembly recess and comprising at least one outward protrusion protruding laterally outward from a side surface thereof,
   wherein the first assembly recess is formed to include at least one inward protrusion protruding laterally inward from a side surface of the partition defining the first assembly recess,
   wherein the first assembly recess is symmetrical along a first axis bisecting the at least one inward protrusion and the first semiconductor light emitting element is symmetrical along a second axis bisecting the at least one outward protrusion wherein positioning of the first semiconductor light emitting element in the first assembly recess requires the first axis and the second axis being misaligned.

2. The display device of claim 1, wherein:
   a minimum width X1 of the first assembly recess is equal to or greater than a minimum width Y1 of the first semiconductor light emitting element;
   a maximum width X2 of the first assembly recess is equal to or greater than a maximum width Y2 of the first semiconductor light emitting element; and
   the maximum width Y2 of the first semiconductor light emitting element is greater than the minimum width X1 of the first assembly recess.

3. The display device of claim 2, wherein the first semiconductor light emitting element has a circular shape apart from the at least one outward protrusion.

4. The display device of claim 3, wherein the first assembly recess has a circular shape apart from the at least one inward protrusion.

5. The display device of claim 4, wherein a number of the at least one outward protrusion of the first semiconductor light emitting element is equal to a number of the at least one inward protrusion of the partition.

6. The display device of claim 1, further comprising a second assembly recess defined by the partition and a second semiconductor light emitting element disposed in the second assembly recess.

7. The display device of claim 6, wherein the second semiconductor light emitting element has a shape different from a shape of the first semiconductor light emitting element, and the second assembly recess has a shape corresponding to the shape of the second semiconductor light emitting element.

8. The display device of claim 7, wherein the first semiconductor light emitting element is configured to emit light of a first color, and the second semiconductor light emitting element is configured to emit light of a second color different from the first color.

9. The display device of claim 8, wherein each of the first semiconductor light emitting element and the second semiconductor light emitting element comprises a magnetic layer.

10. A manufacturing method of a display device, the manufacturing method comprising:
    forming a plurality of semiconductor light emitting elements having at least two different shapes on growth substrates;
    preparing an assembly substrate provided with assembly recesses configured to accommodate the semiconductor light emitting elements therein, wherein the assembly recesses comprise a first assembly recess formed to include at least one inward protrusion protruding laterally inward from a side surface defining the first assembly recess and configured to accommodate at least one shape of the semiconductor light emitting elements that comprises at least one outward protrusion protruding laterally outward from a side surface thereof;
    separating the semiconductor light emitting elements from the growth substrates and introducing the semiconductor light emitting elements into a chamber filled with a fluid; and
    positioning the assembly substrate at a top of the chamber and causing the semiconductor light emitting elements to be assembled in the assembly recesses of the assembly substrate using a magnetic field and an electric field,
    wherein the at least one shape of the semiconductor light emitting elements is symmetrical along a first axis bisecting the at least one outward protrusion, wherein the first assembly recess is symmetrical along a second axis bisecting the at least one inward protrusion, and wherein positioning of the first semiconductor light emitting element in the first assembly recess requires the first axis and the second axis being misaligned.

11. The manufacturing method according to claim 10, wherein:
    each of the semiconductor light emitting elements comprises a magnetic layer; and
    causing the semiconductor light emitting elements to be assembled in the assembly recesses comprises positioning an assembly apparatus having a magnetic body at a rear of the assembly substrate to cause the semiconductor light emitting elements to come into contact with the assembly recesses of the assembly substrate by a magnetic field generated based on movement of the assembly apparatus.

12. The manufacturing method according to claim 11, wherein:
    the movement of the assembly apparatus comprises a rotational movement to cause rotation of the semiconductor light emitting elements by the magnetic field to facilitate contacting the assembly recesses of the assembly substrate.

13. The manufacturing method according to claim 10, further comprising:
    transferring the semiconductor light emitting elements assembled on the assembly substrate to a transfer substrate; and
    transferring the semiconductor light emitting elements transferred to the transfer substrate to a wiring substrate.

14. The manufacturing method according to claim 13, wherein the transferring the semiconductor light emitting elements to the wiring substrate comprises:
    forming wired electrodes and a conductive adhesive layer on the wiring substrate; and
    transferring the semiconductor light emitting elements from the transfer substrate to the conductive adhesive layer of the wiring substrate.

15. The manufacturing method according to claim 10, wherein the semiconductor light emitting elements are micrometer-sized light emitting diodes (micro-LEDs).

* * * * *